(12) United States Patent
Das Sharma et al.

(10) Patent No.: US 12,244,326 B2
(45) Date of Patent: Mar. 4, 2025

(54) ENCODER AND DECODER OF FORWARD ERROR CORRECTION (FEC) CODEC

(71) Applicant: Intel Corporation, Santa Clara, CA (US)

(72) Inventors: Debendra Das Sharma, Saratoga, CA (US); Swadesh Choudhary, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/355,332

(22) Filed: Jul. 19, 2023

(65) Prior Publication Data

US 2023/0370095 A1 Nov. 16, 2023

Related U.S. Application Data

(63) Continuation of application No. 16/900,637, filed on Jun. 12, 2020, now Pat. No. 11,770,138.

(60) Provisional application No. 63/006,979, filed on Apr. 8, 2020.

(51) Int. Cl.
*H03M 13/00* (2006.01)
*G06F 13/42* (2006.01)
*H03M 13/15* (2006.01)

(52) U.S. Cl.
CPC ..... *H03M 13/6502* (2013.01); *G06F 13/4282* (2013.01); *G06F 2213/0026* (2013.01); *H03M 13/1575* (2013.01)

(58) Field of Classification Search
CPC .............................. H03M 13/6502
See application file for complete search history.

(56) References Cited

U.S. PATENT DOCUMENTS 5,751,732 A     5/1998  Im
5,805,616 A *   9/1998  Oh ...................... H03M 13/151
                                                714/784
5,887,006 A     3/1999  Sharma
                (Continued)

FOREIGN PATENT DOCUMENTS

EP          2434650 A      3/2012

OTHER PUBLICATIONS

Notice of Allowance issued May 2, 2023 for U.S. Appl. No. 16/900,637, 13 pages.

(Continued)

*Primary Examiner* — Joseph D Torres
(74) *Attorney, Agent, or Firm* — Schwabe, Williamson & Wyatt, P.C.

(57) ABSTRACT

A FEC codec for generating a check byte for a message. The FEC codec includes a port encoder having a storage unit, a Galois field multiplier, and a sum unit. The storage unit stores a first staged result, which is accumulated based on previous sets of input byte of the message for all clock cycles from a first clock cycle to a clock cycle immediately prior to the current clock cycle. The Galois field multiplier performs a Galois field multiplication of the first staged result and a power of the alpha to generate a Galois field product. The sum unit performs a Galois field addition on an internal input based on a consolidated byte for the current clock cycle and the Galois field product to generate a second staged result for subsequent use to generate the check byte. Other embodiments may be described and/or claimed.

20 Claims, 15 Drawing Sheets

(56) References Cited

U.S. PATENT DOCUMENTS

| | | | |
|---|---|---|---|
| 5,889,793 A * | 3/1999 | Sharma | H03M 13/151 |
| | | | 714/784 |
| 6,802,040 B1 | 10/2004 | Ohyama et al. | |
| 6,990,624 B2 * | 1/2006 | Dohmen | H03M 13/1535 |
| | | | 714/784 |
| 8,327,242 B1 | 12/2012 | Anholt et al. | |
| 8,347,192 B1 * | 1/2013 | Langhammer | G06F 7/724 |
| | | | 714/784 |
| 8,397,143 B2 * | 3/2013 | Neznanov | H03M 13/151 |
| | | | 714/784 |
| 11,770,138 B2 * | 9/2023 | Das Sharma | H03M 13/1515 |
| | | | 714/776 |
| 2003/0101406 A1 | 5/2003 | Song | |
| 2006/0090119 A1 * | 4/2006 | Dong | H03M 13/1515 |
| | | | 714/784 |
| 2009/0323563 A1 * | 12/2009 | Ho | H04B 7/0695 |
| | | | 370/280 |
| 2020/0106460 A1 * | 4/2020 | Ku | H03M 13/152 |

OTHER PUBLICATIONS

Choi, Sungsoo et al. "Design for High-Speed RS-CODEC Based on Galois-Field Arithmetics" 2APCC/MDMC '04. The 2004 Joint Conference of the 10th Asia-Pacific Conference on Communications and the 5th International Symposium on Multi-Dimensional Mobile Communications Proceeding, Aug. 2004, 5 pages.

Extended European Search Report issued Apr. 30, 2024 for EP Application No. 20210548.2, 8 pages.

* cited by examiner

```
module ecc_x8_encoder
(
    input  logic [7:0]data_in [83:0],
    output logic [7:0]data_out[85:0]
);
logic [7:0]    synd_parity;
logic [7:0]    synd_check;
`include "alpha_powers.vh"

always_comb begin
    synd_parity = 8'h00;
    synd_check  = 8'h00;
    for (int i=0;i<84;i++) begin
        data_out[i] = data_in[i];
        synd_parity ^= data_in[i];
201     synd_check ^= (((8{data_in[i][0]}) & i_to_alpha_power_i[84-i]) ^
                       ((8{data_in[i][1]}) & i_to_alpha_power_i[85-i]) ^
                       ((8{data_in[i][2]}) & i_to_alpha_power_i[86-i]) ^
                       ((8{data_in[i][3]}) & i_to_alpha_power_i[87-i]) ^
                       ((8{data_in[i][4]}) & i_to_alpha_power_i[88-i]) ^
                       ((8{data_in[i][5]}) & i_to_alpha_power_i[89-i]) ^
                       ((8{data_in[i][6]}) & i_to_alpha_power_i[90-i]) ^
                       ((8{data_in[i][7]}) & i_to_alpha_power_i[91-i]);
    end
    data_out[84]=synd_check;
    data_out[85]=synd_parity;
end
endmodule // ecc_x8_encoder
```

```
module ecc_x8_decoder
(
    input logic [7:0] data_in[85:0],
    output logic [7:0] data_out[83:0],
    output logic [7:0] error_magnitude,
    output logic [6:0] error_byte,
    output logic no_error,
    output logic single_error,
    output logic multiple_error
);

logic [7:0]   synd_parity;
logic [7:0]   synd_check;
logic synd_parity_0;
logic synd_check_0;
logic [7:0] synd_parity_map_i;
logic [7:0] synd_check_map_i;
logic [7:0] error_column;
logic [7:0] synd_parity_map_i_off;
logic [8:0] error_byte_result;

`include "alpha_powers.vh"
logic [7:0] encoded_data[85:0]; ◄─── 801 ecc_x8_encoder dut (
                .data_in ( data_in[83:0] ),
                .data_out ( encoded_data[85:0] )
);

assign synd_parity = encoded_data[85] ^ data_in[85]; ◄─── 803
assign synd_check  = encoded_data[84] ^ data_in[84]; ◄─── 805
assign synd_parity_0 = (synd_parity==8'h00);
assign synd_check_0  = (synd_check == 8'h00);
assign synd_parity_map_i = alpha_power_i_to_i[synd_parity];
  // alpha to power of what is synd_parity
assign synd_check_map_i = alpha_power_i_to_i[synd_check];
  // alpha to power of what is synd_check
assign error_byte = error_byte_result[6:0];
```

FIG. 8A

```
always_comb begin
    no_error=1'b0;
    single_error=1'b0;
    multiple_error =1'b0;
    data_out = data_in[83:0];
    error_byte_result = 9'd0;
    synd_parity_map_i_eff = synd_parity_map_i;
    error_magnitude = synd_parity;

unique casez({~synd_check_0, ~synd_parity_0})
    2'b00: begin
       no_error = 1'b1;
    end
    2'b01: begin
       single_error = 1'b1;
       error_byte_result = 9'd85;
    end
    2'b10: begin
       single_error=1'b1;
       error_magnitude = synd_check;
       kerror_byte_result = 9'd84;
    end
    2'b11: begin
       if (synd_check_map_i < synd_parity_map_i) begin
           error_byte_result = 9'd84 - (9'd255+ {1'b0, synd_check_map_i} -
{1'b0, synd_parity_map_i_eff});
       end else begin
           error_byte_result = 9'd84 - ({1'b0,synd_check_map_i}-
{1'b0,synd_parity_map_i_eff});
       end if (error_byte_result > 9'd85) begin
           multiple_error = 1'b1;
       end else begin //flip the column
               single_error=1'b1;
           data_out[error_byte_result[6:0]] ^= synd_parity;
       end
    end
    endcase
end
endmodule // ecc_x8_decoder
```

FIG. 8B

```
assign parityrcvd = datain[85];
assign checkrcvd  = datain[84];
always_comb begin
    checkgen2 = '0;
    paritygen2 = '0;
    for (int i=0;i<84;i++) begin
        paritygen2 ^= datain[i];
        checkgen2 ^= checkgencomb[i];
    end
end
assign syndparity = (paritygen2 ^ parityrcvd) & {8{checkparityvalid}};
assign syndcheck  = (checkgen2 ^ checkrcvd) & {8{checkparityvalid}};
always_comb begin
    for (int i=0;i<84;i++) begin
        dataerrorcomb[i] = datain[i] ^ syndparity;
    end
end
always_comb begin
    for (int i=0;i<84;i++) begin
        checkgencomb[i] = (({8{datain[i][0]}} & 1_to_alpha_power_1[84-i])
                        ^ ({8{datain[i][1]}} & 1_to_alpha_power_1[85-i])
                        ^ ({8{datain[i][2]}} & 1_to_alpha_power_1[86-i])
                        ^ ({8{datain[i][3]}} & 1_to_alpha_power_1[87-i])
                        ^ ({8{datain[i][4]}} & 1_to_alpha_power_1[88-i])
                        ^ ({8{datain[i][5]}} & 1_to_alpha_power_1[89-i])
                        ^ ({8{datain[i][6]}} & 1_to_alpha_power_1[90-i])
                        ^ ({8{datain[i][7]}} & 1_to_alpha_power_1[91-i]));
```

FIG. 9A

```
paritygencomb[i] = (((|8(dataerrorcomb [i][0])) 
                    |({8(dataerrorcomb[i][1])} & i_to_alpha_power_i[85~i])
                    |({8{dataerrorcomb[i][2]}} & i_to_alpha_power_i[86~i])
                    |({8{dataerrorcomb[i][3]}} & i_to_alpha_power_i[87~i])
                    |({8{dataerrorcomb[i][4]}} & i_to_alpha_power_i[88~i])
                    |({8{dataerrorcomb[i][5]}} & i_to_alpha_power_i[89~i])
                    |({8{dataerrorcomb[i][6]}} & i_to_alpha_power_i[90~i])
                    |({8{dataerrorcomb[i][7]}} & i_to_alpha_power_i[91~i])) ^
                    ({8{dataerrorcomb[i]}} & i_to_alpha_power_i[94~i]));
    end
always_comb begin
    for (int i=0;i<84;i++) begin
        correctselect[i] = (checkgencomb[i]^paritygencomb[i])==(syndcheck);
    end
end
always_comb begin
    for (int i=0;i<84;i++) begin
        datacorr[i] = ({8{correctselect[i]}} & syndparity)^ datain[i];
    end
end
```

NON-TRANSITORY COMPUTER READABLE STORAGE MEDIUM

1004

PROGRAMMING INSTRUCTIONS

CONFIGURED TO CAUSE A DEVICE, IN RESPONSE TO EXECUTION OF THE PROGRAMMING INSTRUCTIONS, TO PRACTICE (ASPECTS OF) EMBODIMENTS OF THE METHODS DESCRIBED HEREIN

FIG. 11

ENCODER AND DECODER OF FORWARD ERROR CORRECTION (FEC) CODEC

RELATED APPLICATIONS

The present application is a continuation of U.S. application Ser. No. 16/900,637 filed Jun. 12, 2020 entitled "ENCODER AND DECODER OF FORWARD ERROR CORRECTION (FEC) CODEC", which claims priority under 35 U.S.C. § 119 to U.S. Provisional Application No. 63/006,979 filed on Apr. 8, 2020, the contents of which are hereby incorporated by reference in their entireties.

FIELD

Various embodiments generally may relate to the field of communication and computing, and in particular, may relate to an encoder/decoder for forward error correction (FEC) codec, having particular application to a computer bus and/or devices coupled with a computer bus.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A computer system, or a platform, may include many components, such as a host including a central processing unit (CPU), memory, chipsets, and/or many other devices coupled together by one or more computer buses. A computer bus is a communication system that may transfer data between devices or components inside a computer, or between computers. A computing system or a platform may use various devices coupled to a computer bus extensively. A computer bus may include related hardware components (wire, optical fiber, etc.) and software, including communication protocols. There may be many kinds of computer bus, such as serial buses or parallel buses. A codec may include an encoder, a decoder, or both.

BRIEF DESCRIPTION OF THE FIGURES

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 2 illustrates an example flat forward error correction (FEC) encoder implementation, in accordance with various embodiments.

FIGS. 6*a* and 6*b* (collectively referred to herein as "FIG. 6") illustrates Alpha powers for a ×8 configuration, in accordance with various embodiments.

FIG. 7 illustrates Alpha Powers for a ×4 configuration, in accordance with various embodiments.

FIGS. 8*a* and 8*b* (collectively referred to herein as "FIG. 8") illustrate an example decoding algorithm, in accordance with various embodiments.

FIGS. 9*a* and 9*b* (collectively referred to herein as "FIG. 9") illustrates an alternative example decoding algorithm, in accordance with various embodiments.

FIG. 11 illustrates a storage medium having instructions for practicing methods described with references to FIGS. 1-10, in accordance with various embodiments.

DETAILED DESCRIPTION

Figure 1:
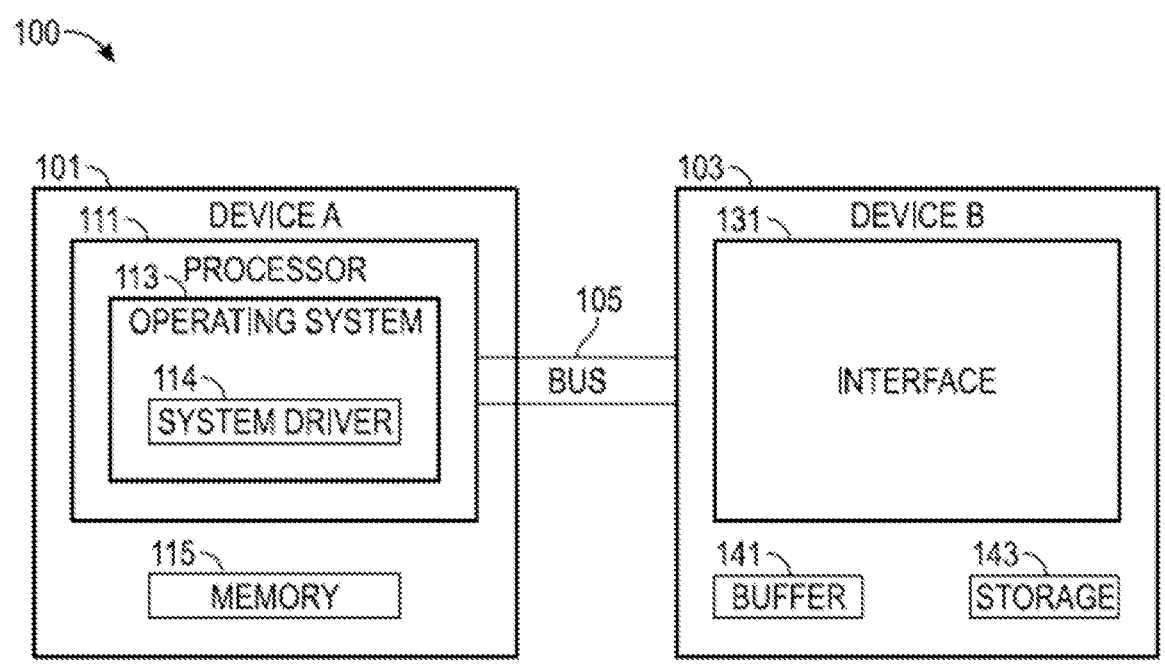
FIG. 1 illustrates an example apparatus including a device coupled to another device by a computer bus, in accordance with various embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

A computing system or a platform may use various devices coupled to a computer bus extensively. A computer bus may include related hardware components (wire, optical fiber, etc.) and software, including communication protocols. A peripheral component interconnect (PCI) bus or a PCI Express (PCIe, PCI-E) may be a computer bus based on a specification that provides a mechanism for system software, or a system driver, to perform various operations related to the configuration of a device coupled to the PCI bus or the PCIe bus. Devices, or components coupled to a computer bus may also be referred to as functions. PCIe may operate in consumer, server, and industrial applications, as a motherboard-level interconnect (to link motherboard-mounted peripherals), a passive backplane interconnect, and as an expansion card interface for add-in boards. PCIe devices communicate via a logical connection called an interconnect or link. A link is a point-to-point communication channel between two PCIe ports allowing both of them to send and receive ordinary PCI requests, e.g., configuration, input/output (I/O), or memory read/write, and interrupts. At the physical level, a link may be composed of one or more lanes. Low-speed peripherals, such as an 802.11 Wi-Fi card, use a single-lane (×1) link, while a graphics adapter typically uses a much wider and faster 16-lane link. Each lane of a PCI Express connection contains two pairs of wires—one to send and one to receive. Packets of data move across the lane at a rate of one bit per cycle. A ×1 connection, the smallest PCIe connection, has one lane made up of four wires. It carries one bit per cycle in each direction. A ×2 link contains eight wires and transmits two bits at once, a ×4 link transmits four bits, and so on. Other configurations are ×12, ×16 and ×32.

In the description below, a PCI bus or a PCIe bus may be used as an example of a computer bus. More details of PCIe may be found in PCIe's website "http://www.pcisig.com."

Similarly, a PCI device or a PCIe device may be used as an example of a device coupled to a computer bus. Descriptions about a PCIe device may be applicable to any other device coupled to any computer bus.

Embodiments herein present efficient implementations of the forward error correction (FEC) codec designed for a computer bus, e.g., PCIe Gen6 specification. These implementations can reduce area and latency. These codecs may be used for the next generation of Compute Express Link (CXL) and Ultra Path Interconnect (UPI) interconnects as well, but for different flit sizes. Different options of implementing the encoder and decoder are given. Embodiments herein may be useful for the computer bus ecosystem to have a low-latency implementation.

Embodiments herein present a flat implementation of FEC encoder. A pipelined implementation of the FEC encoder is presented for different link subdivisions to have reduced implementation areas. The encoder uses the properties of Galois Field (GF) arithmetic to greatly reduce area overhead. A flat implementation of FEC decoder is presented as well. The decoder may have reduced latency for FEC decoding that helps the number of logic levels in the critical path. Embodiments herein offer an area-efficient and latency improved pipelined version that can be used across multiple protocols (PCIe 6.0, CXL, UPI) on the same pins and even in the presence of link sub-division (e.g., ×16, 2×8s, 4×4s, etc.).

Embodiments herein present a FEC codec for generating a check byte for a message. The FEC codec includes a port encoder to perform a set of operations on a current set of input bytes of the message for a current clock cycle. The port encoder includes a storage unit, a Galois field multiplier coupled to the storage unit, and a sum unit coupled to the Galois field multiplier and the storage unit. The storage unit is to store a first staged result, which is accumulated based on previous sets of input bytes of the message for all clock cycles from a first clock cycle to a clock cycle immediately prior to the current clock cycle. The Galois field multiplier is to receive the first staged result and a first power of an alpha for the current clock cycle, and to perform a Galois field multiplication of the first staged result and the first power of the alpha to generate a first Galois field product for the current clock cycle. The sum unit is to perform a Galois field addition on an internal input based on a consolidated byte for the current clock cycle and the first Galois field product to generate and store a second staged result in the storage unit, for subsequent use to generate the check byte. The consolidated byte for the current clock cycle is a Galois field summation of a second set of multiple Galois field products generated based on the current set of input bytes and a second set of multiple powers of the alpha. A Galois field product of the second set of multiple Galois field products is a Galois field product of an input byte of the current set of input bytes, and a power of the alpha selected from the second set of multiple powers of the alpha. The alpha is a unit root of a primitive polynomial over a Galois field.

Embodiments herein present a communication device including a set of multiple FEC encoders. Each FEC encoder receives an input message as a part of an input string to the communication device. A FEC encoder is further arranged to divide an input message of the multiple input messages to the FEC encoder into multiple input sub strings to feed into one or more port encoders of the FEC encoder in multiple clock cycles to generate a check byte for the input message to the FEC encoder. An input substring at a current clock cycle includes a current set of input bytes of the message for the current clock cycle. A port encoder of the one or more port encoders includes a set of multiple Galois field multipliers, one or more Galois field adders coupled to the set of multiple Galois field multipliers, and a storage unit. The set of multiple Galois field multipliers are to generate a set of multiple Galois field products based on the current set of input bytes of the message and a set of multiple powers of an alpha. A Galois field product of the set of multiple Galois field products is a Galois field product of an input byte of the current set of input bytes, and a power of the alpha selected from the set of multiple powers of the alpha. The alpha is a unit root of a primitive polynomial over a Galois field. The one or more Galois field adders are to generate a Galois field summation of the set of multiple Galois field products as a consolidated byte for the current clock cycle. The storage unit is to store a staged result for the current clock cycle, which is accumulated based on previous sets of input bytes of the message for all clock cycles from a first clock cycle to a clock cycle immediately prior to the current clock cycle. The check byte for the input message to the FEC encoder is generated based on the consolidated byte for the current clock cycle and the staged result stored in the storage unit of the port encoder.

Embodiments herein present a method for a FEC codec to generate a check byte for a message. The method includes receiving, at a current clock cycle by a port encoder of the FEC codec, a current set of input bytes of the message to the port encoder, and generating a consolidated byte for the current clock cycle. The consolidated byte is a Galois field summation of a first set of multiple Galois field products generated based on the current set of input bytes and a first set of multiple powers of an alpha. A Galois field product of the first set of multiple Galois field products is a Galois field product of an input byte of the current set of input bytes, and a power of the alpha selected from the first set of multiple powers of the alpha. The method further includes providing, at the current clock cycle, from a storage unit of the port encoder, a first staged result accumulated based on previous sets of input bytes of the message for all clock cycles from a first clock cycle to a clock cycle immediately prior to a current clock cycle. In addition, the method includes performing, by a Galois field multiplier of the port encoder, a Galois field multiplication of the first staged result and a second power of the alpha to generate a second Galois field product for the current clock cycle; and performing, by a sum unit of the port encoder, a Galois field addition on an internal input based on the consolidated byte for the current clock cycle and the second Galois field product to generate and store a second staged result in the storage unit, for subsequent use to generate the check byte. The alpha is a unit root of a primitive polynomial over a Galois field.

Various operations will be described as multiple discrete operations, in turn, in a manner that is most helpful in understanding the illustrative embodiments; however, the order of description should not be construed as to imply that these operations are necessarily order dependent. In particular, these operations may not be performed in the order of presentation.

The phrase "in various embodiments," "in some embodiments," and the like are used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrases "A/B" and "A or B" mean (A), (B), or (A and B), similar to the phrase "A and/or B." For the purposes of the present disclosure, the phrase "at least one of A and B"

means (A), (B), or (A and B). The description may use the phrases "in an embodiment," "in embodiments," "in some embodiments," and/or "in various embodiments," which may each refer to one or more of the same or different embodiments. Furthermore, the terms "comprising," "including," "having," and the like, as used with respect to embodiments of the present disclosure, are synonymous.

Example embodiments may be described as a process depicted as a flowchart, a flow diagram, a data flow diagram, a structure diagram, or a block diagram. Although a flowchart may describe the operations as a sequential process, many of the operations may be performed in parallel, concurrently, or simultaneously. In addition, the order of the operations may be re-arranged. A process may be terminated when its operations are completed, but may also have additional steps not included in the figure(s). A process may correspond to a method, a function, a procedure, a subroutine, a subprogram, and the like. When a process corresponds to a function, its termination may correspond to a return of the function to the calling function and/or the main function.

Example embodiments may be described in the general context of computer-executable instructions, such as program code, software modules, and/or functional processes, being executed by one or more of the aforementioned circuitry. The program code, software modules, and/or functional processes may include routines, programs, objects, components, data structures, etc., that perform particular tasks or implement particular data types. The program code, software modules, and/or functional processes discussed herein may be implemented using existing hardware in existing communication networks. For example, program code, software modules, and/or functional processes discussed herein may be implemented using existing hardware at existing network elements or control nodes.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes. As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like). As used herein, the terms "instantiate," "instantiation," and the like may refer to the creation of an instance, and an "instance" may refer to a concrete occurrence of an object, which may occur, for example, during execution of program code.

As used herein, the term "computer device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. As used herein, the term "user equipment" or "UE" may refer to a device, such as a computer device, with radio communication capabilities and may describe a remote user of network resources in a communications network. The term "user equipment" or "UE" may be considered synonymous to, and may hereafter be occasionally referred to as client, mobile, mobile device, mobile terminal, user terminal, mobile unit, mobile station, mobile user, subscriber, user, remote station, access agent, user agent, receiver, radio equipment, reconfigurable radio equipment, reconfigurable mobile device, etc.

Examples of "computer devices", "computer systems", "UEs", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management System (EEMS), electronic/engine control units (ECUs), electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

FIG. 1 illustrates an example apparatus 100 including a device 101, e.g., a host, coupled to another device 103 by a computer bus 105, in accordance with various embodiments. For clarity, features of the apparatus 100, the device 101, the device 103, and the computer bus 105, are described below as an example. It is to be understood that there may be more or fewer components included in the apparatus 100, the device 101, the device 103, and the computer bus 105. Further, it is to be understood that one or more of the devices and components within the apparatus 100 may include additional and/or varying features from the description below, and may include any device that one having ordinary skill in the art would consider and/or refer to as a host, a device, and a computer bus. In some embodiments, the computer bus 105 may be a PCI, a PCIe, or a CXL interconnect.

In embodiments, the device 101 may include the processor 111 and a memory 115. An operating system 113 may operate on the processor 111, and may include a system driver 114. The device 103 may be coupled to the processor 101 by the computer bus 105. The device 103 may include an interface 131 coupled to the computer bus 105, a buffer 141, and a storage 143. In embodiments, processor 111 and interface 131 are incorporated with the FEC codec teachings of the present disclosure. The interface 131 may include one or more registers, such as a capability header register, an authentication header register, an authentication capability register, an authentication status register, an authentication control register, a write data mailbox register, a read data mailbox register, or some other registers.

In embodiments, the apparatus 100 may be any computing system or platform, for example, a laptop computer, an ultra-laptop computer, a tablet, a touch pad, a portable computer, a handheld computer, a wearable device, a palmtop computer, a personal digital assistant (PDA), an e-reader, a cellular telephone, a combination cellular telephone/PDA, a mobile smart device (e.g., a smart phone, a smart tablet, etc.), a mobile internet device (MID), a mobile messaging device, a mobile data communication device, a mobile media playing device, a camera, a mobile gaming console, etc. In embodiments, the apparatus 100 may also be a non-mobile device that may include, but is not to be limited to, for example, a personal computer (PC), a television, a smart television, a data communication device, a media playing device, a gaming console, a gateway, an Internet of Things (IOT) device, etc. The apparatus 100 may include controllers (or processors) and other components that execute software and/or control hardware to execute local programs or consume services provided by external service providers over a network. For example, the apparatus 100 may include one or more software clients or applications that run locally and/or utilize or access web-based services (e.g., online stores or services, social networking services, etc.). The apparatus 100 may also, or instead, include a web interface running in a browser from which the electronic apparatus can access such web-based services. The apparatus 100 may also include storage devices to store logic and data associated with the programs and services used by the apparatus 100.

In embodiments, the processor 111 may be a central processing unit (CPU). In some embodiments, the processor 111 may be a programmable device that may execute a program, e.g., the system driver 114. In embodiments, the processor 111 may be a microcontroller, a 16-bit processor, a 32-bit processor, a 64-bit processor, a single core processor, a multi-core processor, a digital signal processor, an embedded processor, or any other processor. Except for the teachings of the present disclosure, the processor 111 may be any one of these elements known in the art.

In embodiments, the operating system 113 may be any system software that manages hardware or software resources for the apparatus 100, and may provide services to applications, e.g., the system driver 114. The operating system 113 may be Windows®, Android OS, iOS, Linux, a real-time operating system (RTOS), an automotive infotainment operating system, among others. For example, the operating system 113 may be a real-time operating system such as VxWorks, PikeOS, eCos, QNX, MontaVista Linux, RTLinux, Windows CE, or other operating system.

In embodiments, the computer bus 105 may be an external computer bus, an internal computer bus, a serial computer bus, or a parallel computer bus. For example, the computer bus 105 may be a PCI bus, a PCI Extended bus (PCI-X), a PCI express bus, a universal serial bus (USB), a parallel advanced technology attachment (PATA) bus, a serial ATA (SATA) bus, an inter-integrated circuit ($I^2C$) bus, an IEEE 1394 interface (FireWire) bus, a small computer system interface (SCSI) bus, a scalable coherent interface (SCI) bus, or other computer bus.

In embodiments, the device 103 may be any piece of computer hardware. For example, the device 103 may be a network interface card, an audio card, a video controller, an Ethernet controller, a webcam, mouse, a Bluetooth controller, a PCI to ISA bridge, a GUI Accelerator, an ATM Controller, a multimedia card, a SCSI controller, a multimedia device, a MPEG-II Video Decoder, or any input/output device. In embodiments, the device 103 may be a PCI device, which may be plugged directly into a PCI slot on a computer's motherboard. In some other embodiments, the device 103 may be coupled to the processor 111 by a different computer bus. Except for the teachings of the present disclosure, the device 103 (including its interface 131) may be any one of these elements known in the art.

FIG. 2 illustrates an example flat FEC encoder implementation, in accordance with various embodiments. The FEC encoder implementation may be applied to a message sent through the computer bus 105 as shown in FIG. 1.

Embodiments herein may present an example applied to a PCI-e bus. For a PCI-e bus, a FEC encoder is defined by generating the check and parity bytes over a 250 byte message $B_i$ to generate 6 bytes of protection (3 check bytes, 3 parity bytes). Each pair of check and parity byte is part of a FEC implementation. The FEC encoder uses 3-way interleaving of 3 codes, with 84, 83 and 83 bytes of message symbols respectively, e.g., as specified in PCIe spec document. A byte of 0 is post-fixed (MSB) on the latter 2 messages to make 3 sets of 84 byte messages and each is fed through a 84 to 86 byte encoder. The check (C) and parity (P) computations are given by the following formulae:

$$C=\Sigma_{i=0}^{83} B_i * \alpha^{(84-i)} \quad \text{(equation 2.1)}$$

$$P=\Sigma_{i=0}^{83} B_i \quad \text{(equation 2.2)}$$

where multiplication (*) and summation (+) are defined over $GF(2^8)$, and $\alpha$, referred to as "alpha," is the polynomial representation of the unit root of the primitive polynomial $x^8+x^4+x^3+x^2+1$ (represented as 0x1D). Hence, the computation of C and P based on equation 2.1 and equation 2.2 is equivalent to a modulo polynomial $x^8+x^4+x^3+x^2+1$ operation. In hardware, addition is equivalent to bitwise XOR of the bytes, and multiplication of byte $B_i$ with $\alpha^x$ is equivalent to ($B_{i0} \alpha^x$ XOR $B_{i1} \alpha^{x+1}$ NOR $B_{i2} \alpha^{x+2}$ ... XOR $B_{i7} \alpha^{x+7}$), where $\alpha^x$ is a byte. Thus, the baseline flat implementation of 84->86 byte encoder is given in FIG. 2 as one possible implementation for the encoders in FIG. 3(b), where the check byte is byte 84, and parity byte is byte 85. The code section 201 in FIG. 2 shows the computation of the check byte C.

For supporting link subdivision, each port could instantiate the flat version, or different ports could time multiplex and use one or more instantiations of the above module.

In embodiments, the check (C) and parity (P) computations may be applied to messages communicated over other kinds of computer bus, with different byte sizes. Additionally and alternatively, the check (C) and parity (P) computations for the PCI-e bus may be applied to a byte size different from 84 byte messages. In general, the check (C) and parity (P) computation may be provided by the following formulae, where L may be a byte size of the message (the number of bytes in a message).

$$C = \sum_{i=0}^{L} B_i * \alpha^{(L-i)} \quad \text{(equation 2.3)}$$

$$P = \sum_{i=0}^{L} B_i \quad \text{(equation 2.4)}$$

Figure 3A:
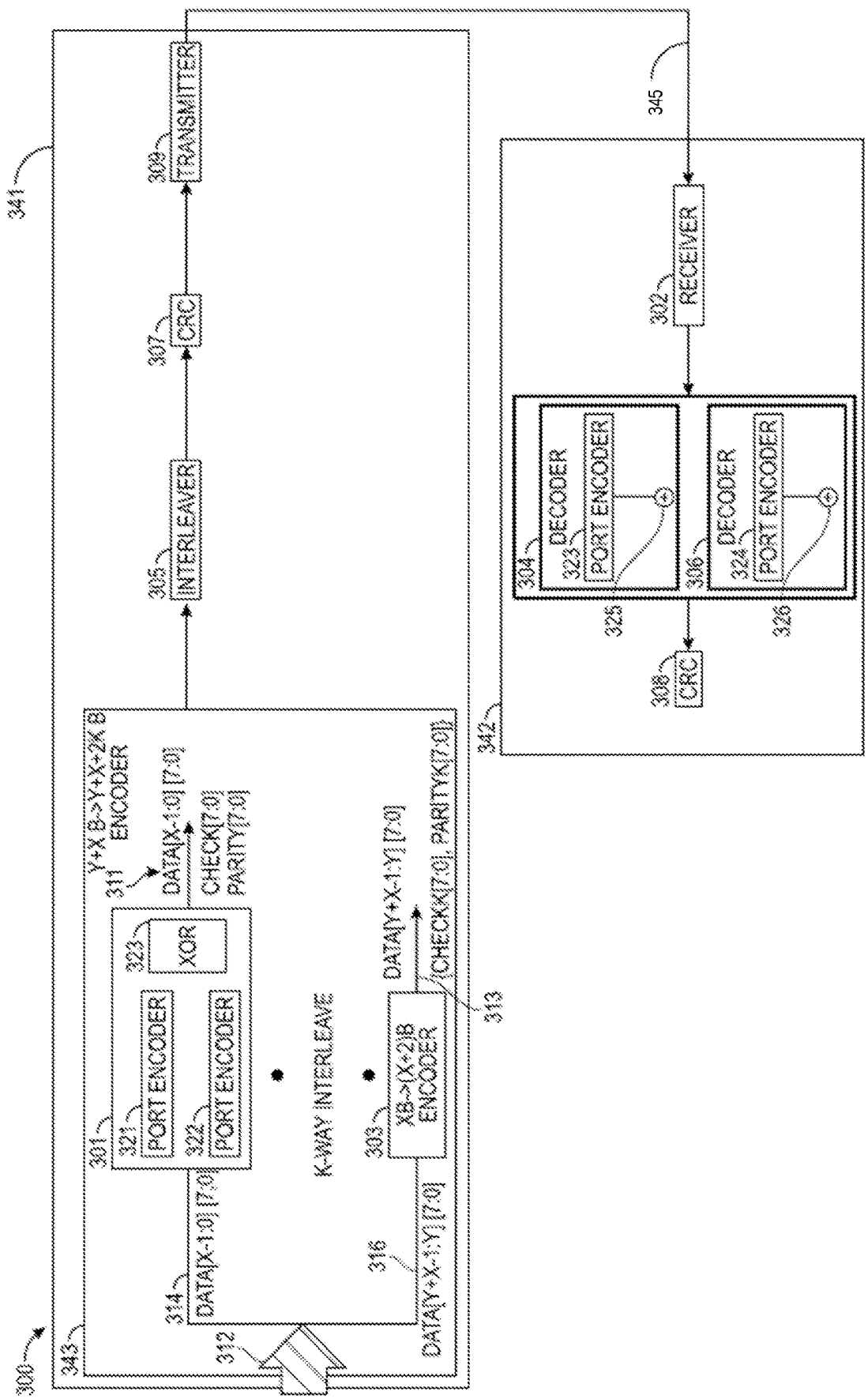
FIGS. 3(*a*)-3(*b*) illustrate example FEC encoders and decoders, in accordance with various embodiments.
Figure 3B:
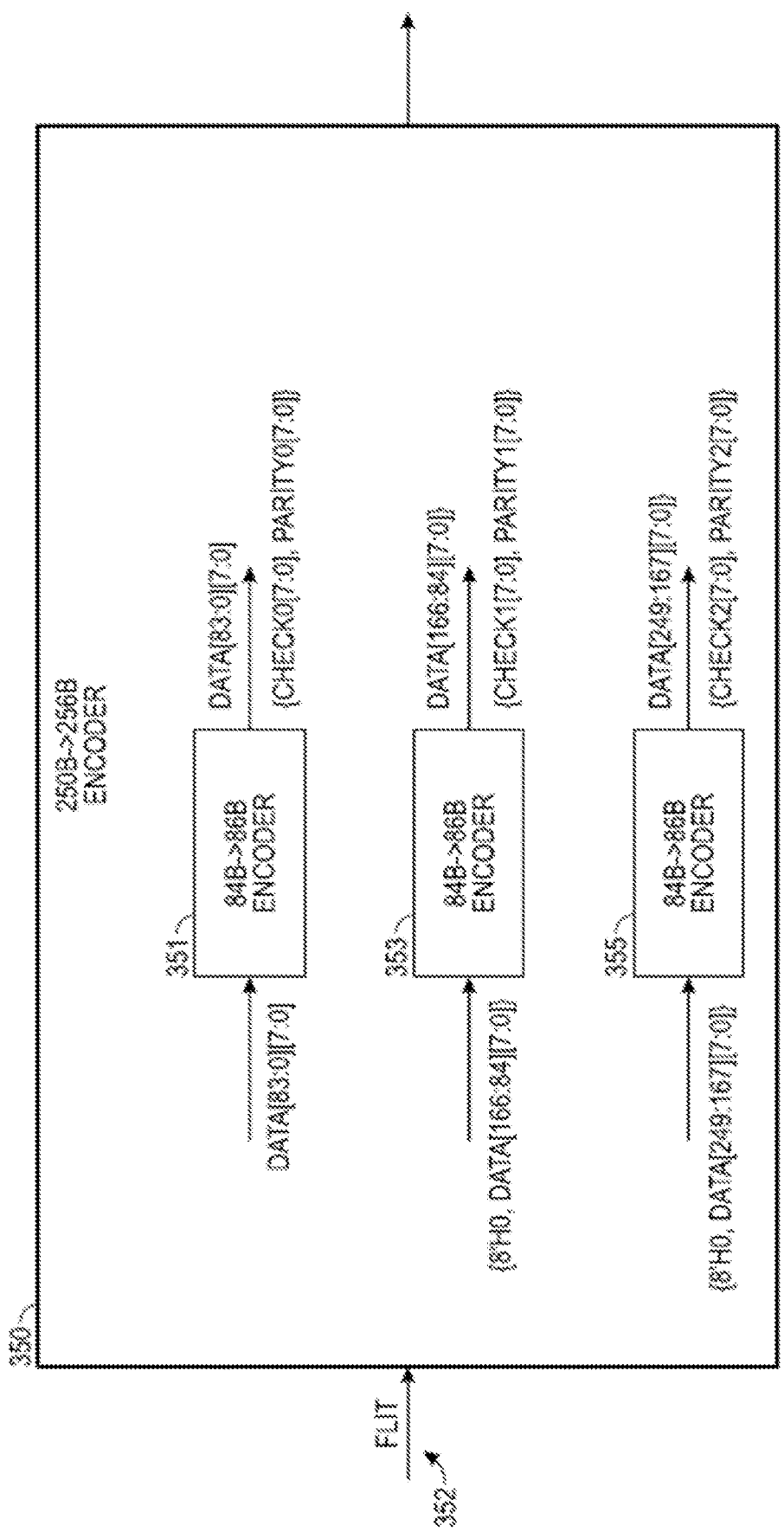

FIGS. 3(a)-3(b) illustrate example FEC encoders and decoders, in accordance with various embodiments. The FEC encoder shown in FIGS. 3(a) and 3(b) may be a pipelined implementation of a FEC encoder that saves area. The computations shown in FIGS. 3(a)-3(b) for the check (C) byte computation are based on equation 2.1 or equation 2.3. When the parity (P) is computed, the computations are based on equations 2.2 or equation 2.4.

FIG. 3(a) shows a communication system 300 including a device 341 coupled to a device 342 through a computer bus 345, which may be an example of the device 101 coupled to the device 103 by the computer bus 105. The device 341 includes an encoder 343 having a set of multiple FEC encoders, e.g., a FEC encoder 301, a FEC encoder 303, and more. The outputs of the encoder 343, including an output 311 of the FEC encoder 301 and an output 313 of the FEC encoder 303, are fed into an interleaver 305, followed by a cyclic redundancy check (CRC) component 307. The result of the CRC operation by the CRC component 307 is passed to a transmitter 309. At other end of the computer bus 345, the device 342 includes a receiver 302, one or more decoders, e.g., a decoder 304 and a decoder 306. The output of the decoder 304 and the decoder 306 are fed into a CRC component 308. Other related operations are performed after the CRC component 308, not shown. The communication system 300 shows one embodiment for the operations for the encoders and decoders. Other configurations are possible, e.g., the interleaver may be placed in different locations, not shown.

In embodiments, each FEC encoder of the multiple FEC encoders, e.g., the FEC encoder 301 or the FECencoder 303, is to receive an input message as a part of an input string to the communication device 341. For example, the FEC encoder 301 is to receive an input message 314, and the FEC encoder 303 is to receive an input message 316, both the input message 314 and the input message 316 are a part of an input string 312 to the device 341. In some embodiments, any two messages of the multiple input messages to feed to the set of multiple FEC encoders have equal length. For example, the input message 314 and the input message 316 have a same length. In some embodiments, the device 341 is disposed in a PCIe bus, the input message 314 or the input message 316 are part of a flit for the PCIe bus, and the input string 312 is a flit.

In embodiments, the input message 314 includes multiple input bytes, Data[x-1:0] . . . [7 . . . 0]. The FEC encoder 301 is to generate the output 311 that includes the multiple input bytes, Data[x-1:0] . . . [7 . . . 0], plus a check byte and a parity byte. Similarly, the input message 316 includes multiple input bytes, Data[Y+x-1:0] . . . [7 . . . 0]. The FEC encoder 303 is to generate the output 313 that includes the multiple input bytes, Data[y+x-1:0] . . . [7 . . . 0], plus a check byte and a parity byte.

In embodiments, FIG. 3(b) shows more details of a flit 352 of size 250 bytes to an encoder 350, where the flit 352 is split into 3 input messages to feed into 3 FEC encoders, a FEC encoder 351, a FEC encoder 353, and a FEC encoder 355. The FEC encoder 351, the FEC encoder 353, and the FEC encoder 355 are identically constituted as any of the encoder, e.g., the encoder 351. In other words, the encoder 351, the FEC encoder 353, and the FEC encoder 355 have the same structure, perform the same functions. The only difference is that the encoder 351, the FEC encoder 353, and the FEC encoder 355 operate on different inputs to generate different outputs. If one switches the position of the encoder 351, the FEC encoder 353, and the FEC encoder 355, the overall circuit 350 would function correctly. Hence, the encoder 351, the encoder 353, or the encoder 355 receives an input message of a same length, e.g., 84 bytes. When a flit of 250 bytes is divided into 3 parts, 84 bytes for a first part, 83 bytes for a second part, and 83 bytes for a third part, a 0 byte (a bye include eight 0s) may be appended at the most significant place or at the least significant place to be the 84 byte for the second part or the third part of the flit. Therefore, the encoder 351, the encoder 353, and the encoder 355 are to operate on an input message of the same length of 84 bytes, and to generate a parity bate and a check byte for each 84 bytes input message. The output of the encoder 350 is of 256 bytes for the flit 352 of 250 bytes. In some other embodiments, the FEC encoder 351, the FEC encoder 353, and the FEC encoder 355 may operate on input messages of different lengths to generate a check byte for the input messages.

In embodiments, a FEC encoder, e.g., the FEC encoder 301, may include one or more port encoders, e.g., a port encoder 321, a port encoder 322, for the computation of check byte, while the details of the computation for the parity byte is not shown. The outputs of the port encoders, e.g., the output of the port encoder 321 and the output of the port encoder 322, may be combined by performing bitwise XOR operations on the bytes using an XOR 323, to generate the check byte for the input message 314. In some embodiments, the FEC encoder 301 may include only one port encoder. The number of port encoders to be included in the FEC encoder 301 may be determined by a port configuration of the FEC encoder 301. The FEC encoder 301 is to divide the input message 314 into multiple input substrings (a set of input bytes of the input message 314) to feed into one or more port encoders of the FEC encoder 301 in multiple clock cycles to generate a check byte for the input message 314 to the FEC encoder 301. A number for the multiple clock cycles used to generate the check byte for the input message 314 to the FEC encoder 301 may depend on a size of the input message, a size of the input string 312, and a width of the port encoder 312 or the port encoder 322. For example, the FEC encoder 301 is to generate the check byte for the input message 314 to the FEC encoder 301 in 2 cycles for a ×16 link in the PCI-e bus, 4 cycles for a ×8 link in the PCI-e bus, or 8 cycles for a ×2 link in the PCI-e bus.

In embodiments, the device 341 further includes the interleaver 305 coupled to the set of multiple FEC encoders, e.g., the FEC encoder 301 and the FEC encoder 303, to receive the output 311 of the FEC encoder 301 and the output 313 of the FEC encoder 303. The output 311 of the FEC encoder 301 includes a check byte generated by the FEC encoder 301 for the input message 314. The output 313 of the FEC encoder 303 includes a check byte generated by the FEC encoder 303 for the input message 316. The interleaver 305 is to generate an output string including the input string 312 plus a number of check bytes generated by the set of multiple FEC encoders, e.g., the FEC encoder 301 and the FEC encoder 303, in addition to some parity bytes generated based on equation (2.2) or equation (2.4), not shown.

In embodiments, one or more port encoders, e.g., a port encoder 323 or a port encoder 324, may be used in a decoder as well to detect the location of an error. Examples of such application can be found in computations related to equation (8.1) in the current disclosure. The decoder 304 includes a Galois field adder 325 and the port encoder 323 to perform bitwise XOR to identify an error location of the message. Similarly, the decoder 306 includes a Galois field adder 326 and the port encoder 324 to perform bitwise XOR to identify an error location of the message. Since a port encoder may be used in a FEC encoder or a FEC decoder, a port encoder can be generally referred to be used in a FEC codec.

Figure 4:
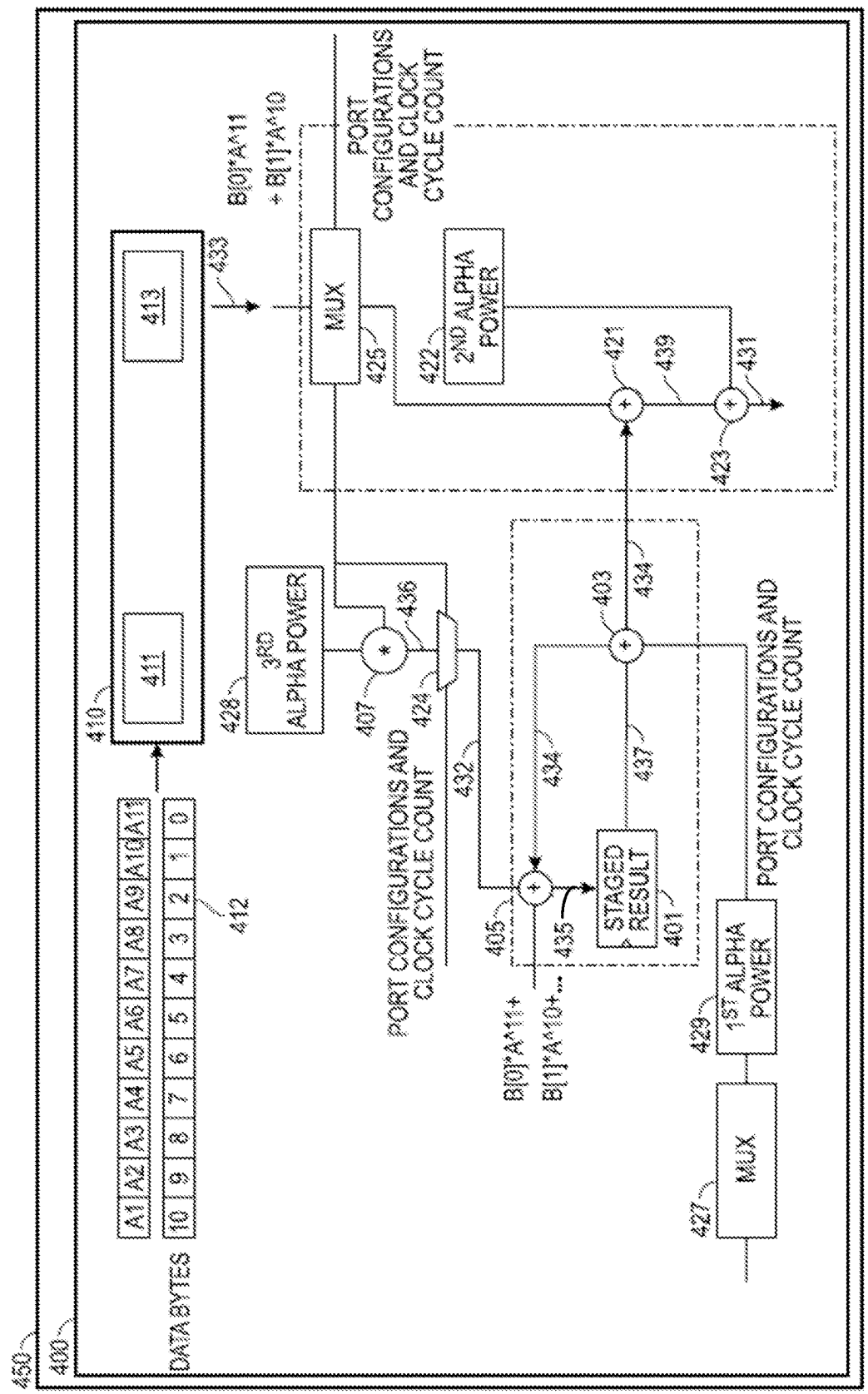
FIG. 4 illustrates a high level logic diagram and operations performed by a port encoder of a FEC codec, in accordance with various embodiments.

In the following, more details of the operations for a port encoder, e.g., the port encoder 321, the port encoder 322 for the FEC encoder 301, or the port encoder 323 and the port encoder 324 used in the decoders, are described. The FEC encoder 301 is to generate a check byte for the input message 314, based on an equation (3.1) show below, which is applied to the equation (2.1) or equation (2.3). More details of a port encoder, e.g., the port encoder 321 or the port encoder 322, are shown in FIG. 4.

When designing a link subdivision supporting controller that shares the data bus between the different supported port mode configurations (eg: ×16, ×8×8, ×8×4×4, ×4×4×8, ×4×4×4×4)—a mathematical property of GF arithmetic can be used to pipeline the encoder efficiently. A computer bus interface may be dynamically configured to support the various port mode configuration. Additionally and alternatively, an interface may be implemented in ASIC in certain specific port mode configurations.

GF arithmetic operations are essentially modulo polynomial operations. In particular, the property to be used is:

$$\alpha^{(x+y)} \bmod g(x) = [\alpha^x [\alpha^y \bmod g(x)]] \bmod g(x) \quad \text{(Equation 3.1)}$$

where $g(x)$ is the primitive polynomial over $GF(2^m)$, e.g., $x^8+x^4+x^3+x^2+1$, m=8 as an example.

Proof of the above property of equation 3.1.

Let $\alpha^{(y)} = a(x)*g(x)+r(x)$, $=>\alpha^{(y)} \bmod g(x)=r(x)$

Let $\alpha^x = b(x)*g(x)+s(x)$, $\alpha^{(x+y)} \bmod g(x) = [\alpha^x \alpha^y] \bmod g(x) = [a(x)*g(x)+r(x)][b(x)*g(x)+s(x)] \bmod g(x) = r(x)*s(x)$.

Similarly, $[\alpha^x[\alpha^y \bmod g(x)]] \bmod g(x) = [[b(x)*g(x)+s(x)]*r(x)] \bmod g(x) = s(x)*r(x)=r(x)*s(x)$(Commutative property).

The above property shown in equation 3.1 is very powerful. It implies that the computation of equation (2.1) or equation (2.3) can be broken down into multiple steps in multiple clock cycles, by extracting a power of alpha before a set of input bytes of the message. An embodiment can accumulate the alpha powers over bytes, and stick to only manipulating 8 bit results and accumulating them with newer bytes that show up in subsequent clock cycles. As an example, for ×16 running at a 128B data path at 1 GHz, depending on which FEC set out of the 3 sets of 84 to 86 encoders, an embodiment can either receiver 42 or 43 Bytes of data in the first cycle, and the remaining 42 or 41 bytes of data in the next cycle. For a ×8, data for 1 set comes over 4 clock cycles, and for a ×4, data for 1 set comes over 8 clock cycles.

Accordingly, an embodiment encoder can support all combinations of ×4, ×8, ×16. The same techniques can be extended to scale up a ×2 or ×1 as well. When building up using 4×4 ports that share a 128B data path, FIG. 4 gives the overall block diagram of a port encoder used in a FEC encoder.

FIG. 4 illustrates a high level logic diagram and operations performed by a port encoder 400 of a FEC codec 450, in accordance with various embodiments. The port encoder 400 may be an example of the port encoder 321 used in the FEC encoder 301, or an example of the port encoder 323 used in the FEC decoder 304. The port encoder 400 may be used in various port configurations for a PCI related bus or other computer bus.

In embodiments, the FEC codec 450 may include multiple port encoder. The port encoder 400 may be a first port encoder of the FEC codec 450, and the FEC codec 450 further includes one or more additional port encoders, where each port encoder of the one or more additional port encoders is identically constituted as the port encoder 400. For example, the port encoder 400 may be an example of the port encoder 321 in the FEC encoder 301, while another port encoder 322 is identically constituted as the port encoder 321 and included in the FEC encoder 301.

In embodiments, the FEC codec 450, e.g., a FEC encoder or a FEC decoder, including the port encoder 400 may be disposed in a PCIe bus and used in various port configurations. For example, the FEC codec 450 includes total 1 port encoder including the port encoder 400 for a ×16 link in the PCI-e bus, or the FEC codec 450 includes total 2 port encoders including the port encoder 400 for a ×8 link in the PCI-e bus; or the FEC codec 450 includes total 4 port encoders including the port encoder 400 for a ×4 link in the PCI-e bus; or the FEC codec 450 includes total 8 port encoders including the port encoder 400 for a ×2 link in the PCI-e bus; or the FEC codec 450 includes total 16 port encoders including the port encoder 400 for a ×1 link in the PCI-e bus. The FEC coded 450 may be dynamically configured to support the various port mode configuration, or have some specific port mode configuration.

Figure 5:
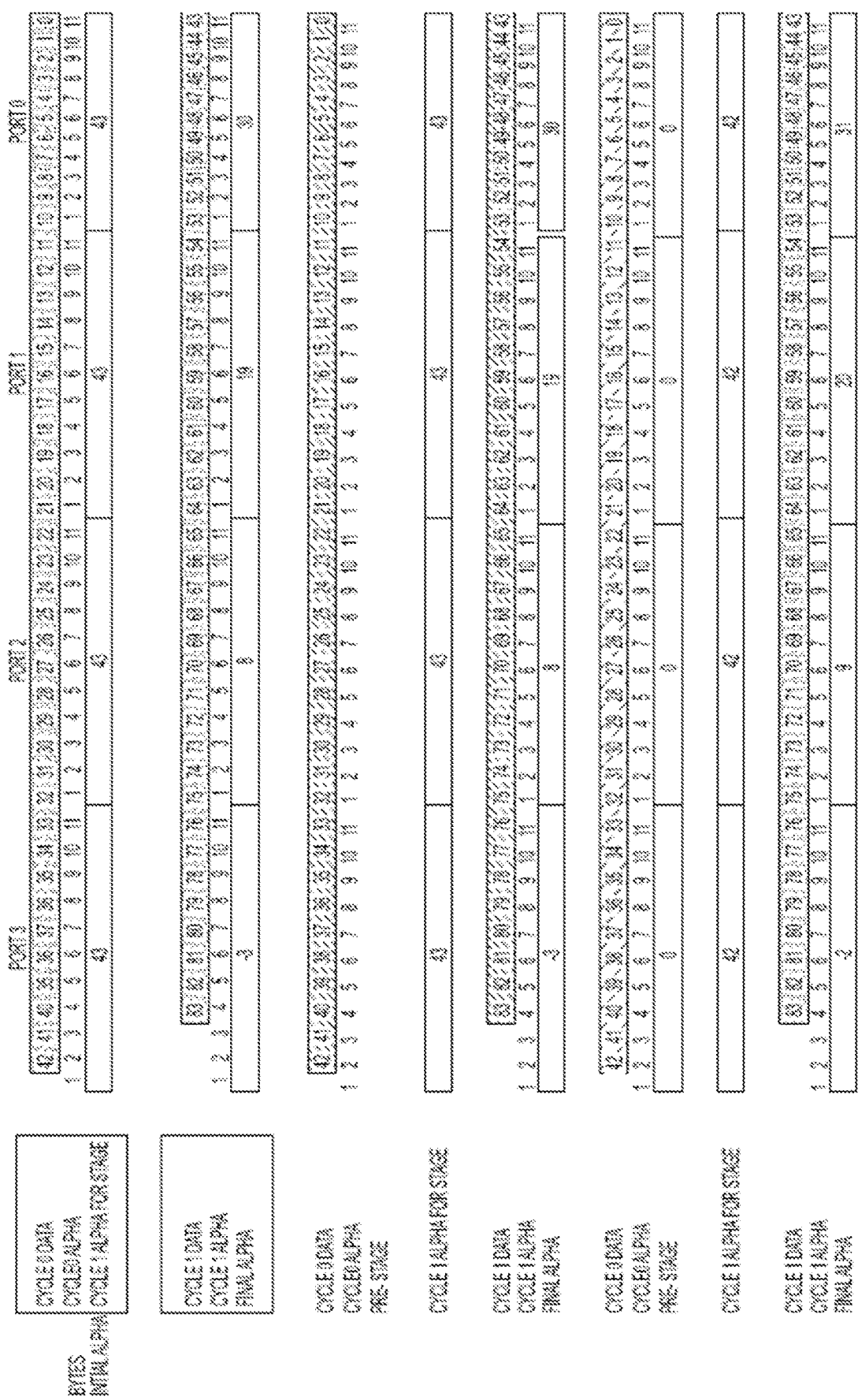
FIG. 5 illustrates Alpha powers and data byte associations for a FEC, in accordance with various embodiments.
Figure 6A:
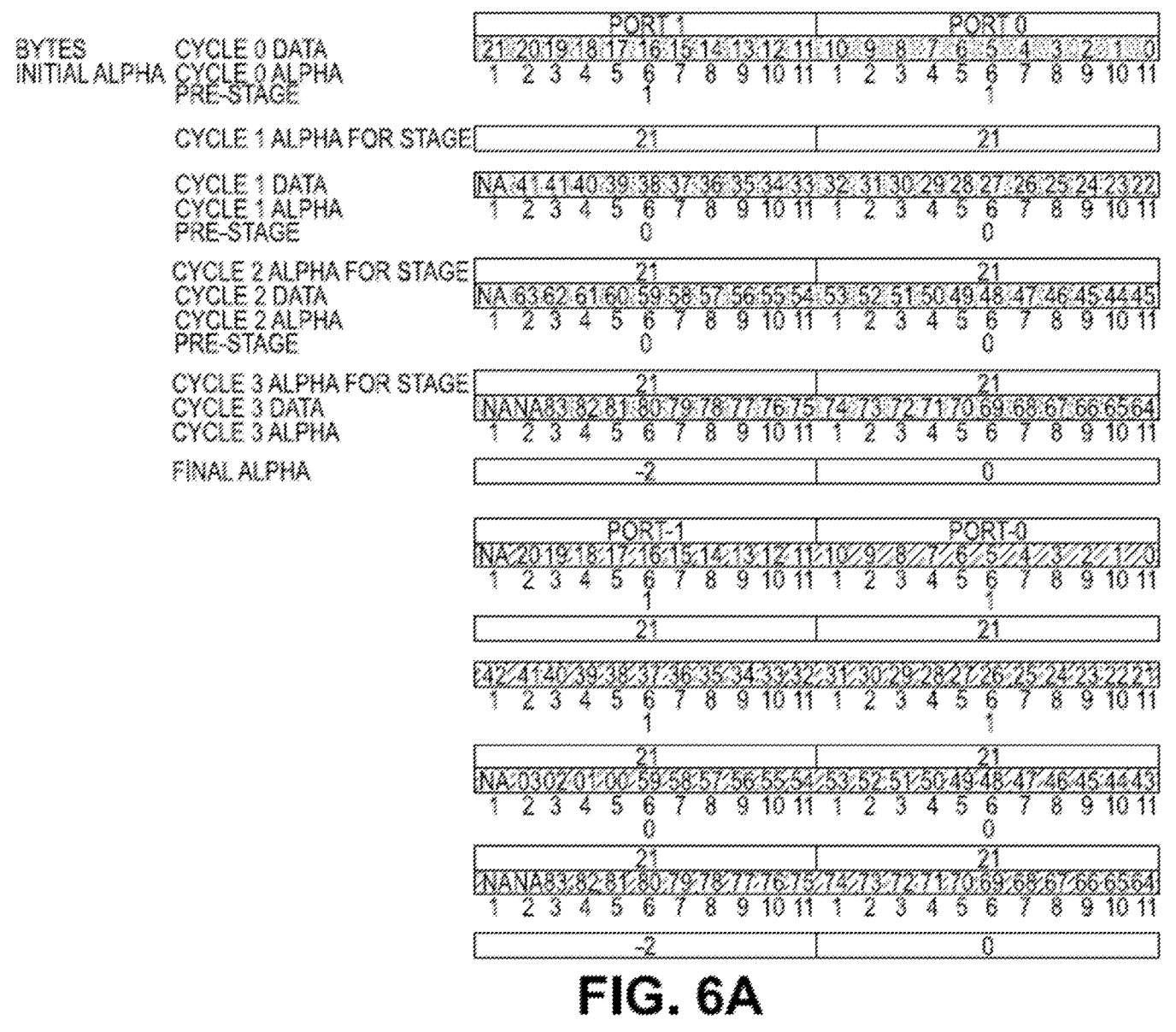
Figure 6B:
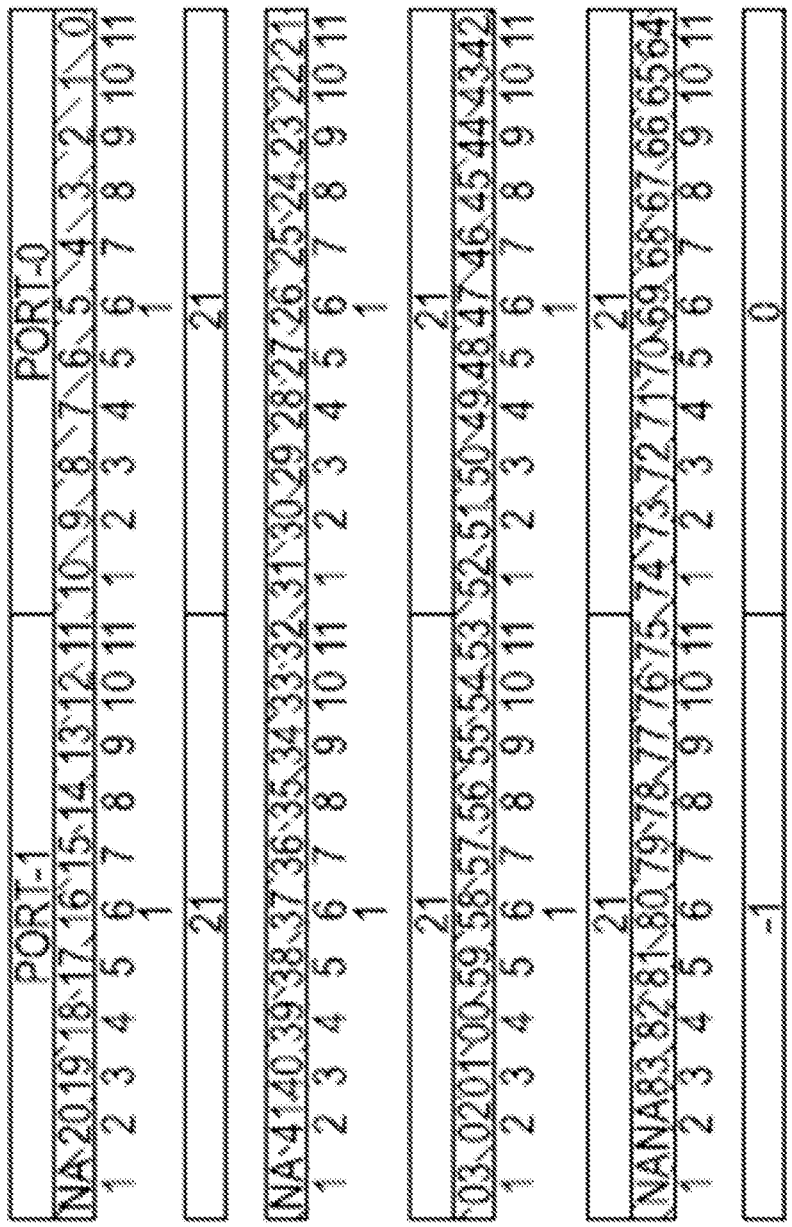
Figure 7:
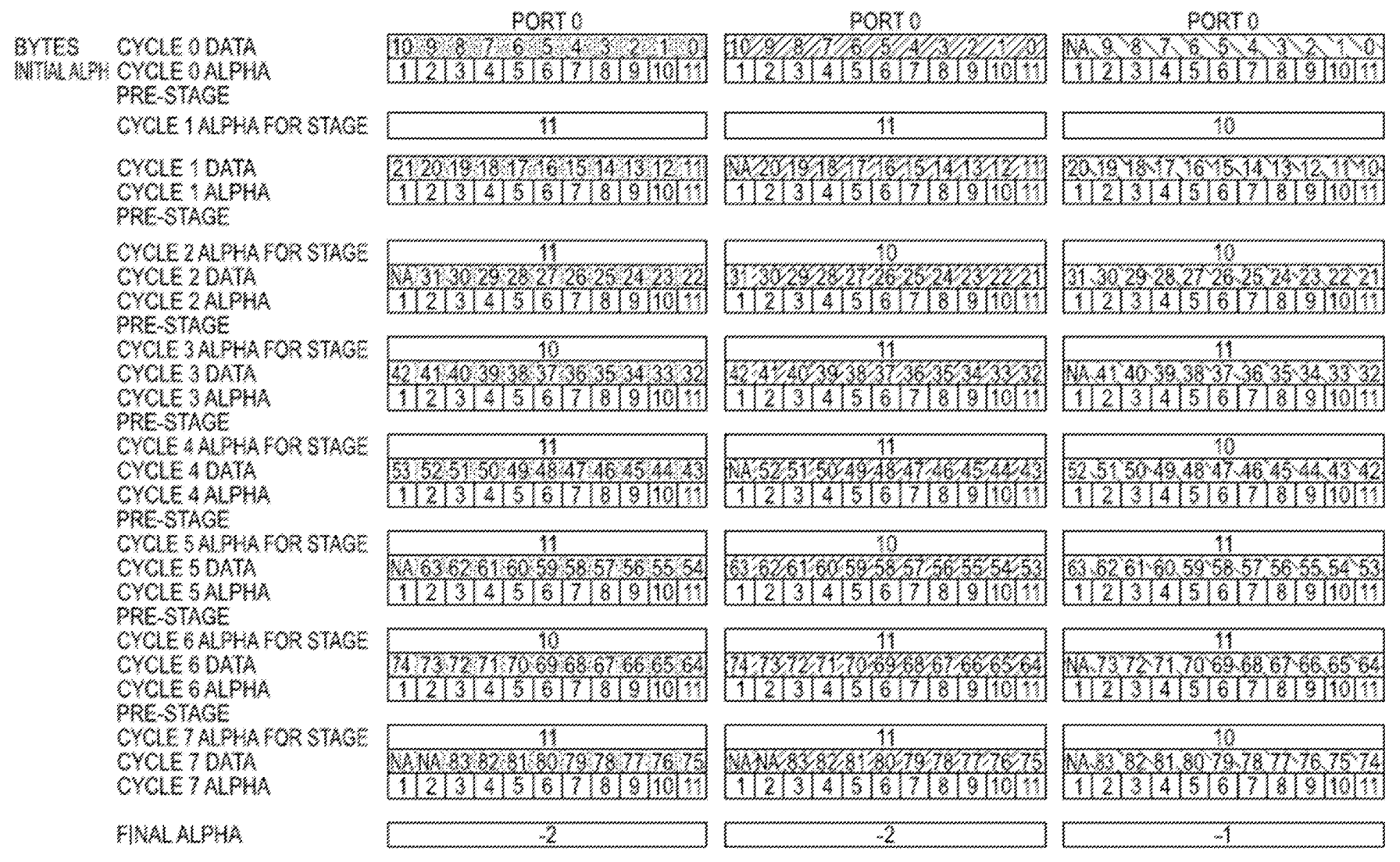

The computation of the port encoder 400 is based on the application of equation 3.1 to equation (2.1) or equation (2.3) for the check byte computation. Hence, various powers of alpha, $\alpha^x$, $\alpha^y$ are used, which may be simply referred to as alpha powers. The alpha is a unit root of a primitive polynomial over a Galois field, where the primitive polynomial is alpha^8+alpha^4+alpha^3+alpha^2+1 ($\alpha^8+\alpha^4+\alpha^3+\alpha^2+1$) and the Galois field is $GF(2^8)$. FIG. 5 illustrates Alpha powers and data byte associations for a FEC a ×8 configuration for 3 FEC encoders, in accordance with various embodiments. FIG. 6 illustrates Alpha powers for a ×8 configuration for 3 FEC encoders, in accordance with various embodiments. FIG. 7 illustrates Alpha Powers for a ×4 configuration for 3 FEC encoders, in accordance with various embodiments.

As shown in FIG. 4, the FEC codec 450 may be an example of the FEC encoder 301 to receive the input message 314 to compute a check byte for the input message 314 over multiple clock cycles, starting from a first clock cycle, a second clock cycle, ... a clock cycle immediately prior to a current clock, the current clock cycle, a next clock cycle, and more, till the final clock cycle when the entire input message is received by the port encoders inside the FEC codec 450. The input message 314 is divided into multiple set of input bytes for different clock cycles, e.g., a current set of input bytes of the input message 314, a set of input bytes of the input message 314 for the next clock cycle. Based on the equation (3.1), the computation of the check byte for the input message 314 can be achieved by computing the check bytes of multiple smaller set of input bytes, and further combining such check bytes together according to the equation (3.1). At each clock cycle, the check byte for the set of input bytes of the input message 314 is represented by a staged result stored in a storage device 401. Hence, a staged result is accumulated based on previous sets of input bytes of the message for all clock cycles from a first clock cycle to a clock cycle immediately prior to the current clock cycle. At the final clock cycle, the check byte based on equation (2.1) or equation (2.3) is computed based on the final staged result. While achieving the same check byte result, the separation of a long input message 314 into multiple smaller set of input bytes for different clock cycles can improve the area for the FEC codec 450. As shown in FIG. 4, a set of input bytes has 11 bytes, which is an example to show the operations for a port encoder used in the FEC encoder 351 as shown in FIG. 3(*b*). Compared to the 84 bytes input message to the FEC encoder 351, the FEC coded 450 based on a set of input bytes with 11 bytes saves area. FIG. 4 only shows one possible implementation. For other examples, a set of input bytes may have a size different from 11 bytes.

Since the ports share data path in the different port mode configurations, embodiments herein show how the logic diagram looks for one port in FIG. 4. The signs "*" and "+" are the GF multiplication and addition operations described above. Each port gets 11 bytes of data for each FEC set. As soon as data bytes come in, they are multiplied with alpha powers 1 through 11 (constants independent of port mode or cycle count) to get a consolidated 8 bit result for the accumulator. On subsequent cycles the staged result are obtained by going through multiple alpha power multiplications. Finally, in the last cycle of data, the consolidated results are obtained and a final Alpha Power2 adjustment is further obtained to get the final check result for a port. If an embodiments is in a ×8 or ×16 configuration, the check byte results of the relevant ports need to be XOR'ed to get the final check result for the input message. Messages with sizes different from a message for a flit, and the input message of a size different from 11 bytes may be similarly implemented according to equation (3.1).

In embodiments, the port encoder 400 includes a Galois field multiplier 403, a storage unit 401, a sum unit 405, a Galois field multiplier 407, a Galois field multiplier 423, a sum unit 421, a selector 424, a selector 425, a selector 427, a set of multiple Galois field multipliers 411, one or more Galois field adders 413, a storage unit 412 to store a current set of input bytes (B0, B1, . . . B10) and a set of multiple powers of the alpha (a1, a2, a3, a4, a5, a6, a7, a8, a9, a10, a11), which represents ($\alpha^1, \alpha^2, \alpha^3, \alpha^4, \alpha^5, \alpha^6, \alpha^7, \alpha^8, \alpha^9, \alpha^{10}, \alpha^{11}$).

In embodiments, the port encoder 400 is to perform a set of operations on the current set of input bytes (B0, B1, . . . B10) of a message for a current clock cycle to generate a first staged result, save the staged result in the storage unit 401. Hence, the first staged result is accumulated based on previous sets of input bytes of the message for all clock cycles from a first clock cycle to a clock cycle immediately prior to the current clock cycle. The first staged result saved in the storage device 401 may be provided to the Galois field multiplier 403. The first staged result is labelled as the first staged result 437 along the line from the storage unit 401 to the Galois field multiplier 403.

In embodiments, at the current clock cycle, the storage unit 412 is to store a current set of input bytes (B0, B1, . . . B10) and a set of multiple powers of the alpha (a1, a2, a3, a4, a5, a6, a7, a8, a9, a10, a11). At different clock cycle, the set of input bytes (B0, B1, . . . B10) are updated. On the other hand, the set of multiple powers of the alpha (a1, a2, a3, a4, a5, a6, a7, a8, a9, a10, a11) may be unchanged and shared among multiple clock cycles.

In embodiments, the set of multiple Galois field multipliers 411 perform a set of multiple Galois field products on the current set of input bytes (B0, B1, . . . B10) and the set of multiple powers of the alpha (a1, a2, a3, a4, a5, a6, a7, a8, a9, a10, a11). For example, for embodiments shown in FIG. 4, 11 Galois field multipliers may be used to generate 11 Galois field products of the form (B0*a11, B1*a10, . . . , B10*a1). The 11 Galois field multipliers perform the Galois field multiplication in parallel to generate 11 Galois field products. In embodiments, as shown, the set of multiple Galois field products includes 11 Galois field products, the set of multiple input bytes for the current clock cycle includes no more than 11 input bytes, and the set of multiple powers of the alpha includes a power of the alpha from 1 to 11. For other examples, other size of the set of input bytes, the set of multiple powers of the alpha, may be used.

In embodiments, the one or more Galois field adders 413 are coupled to the set of multiple Galois field multipliers 411 to generate a consolidated byte 433 for the current clock cycle, to add the multiple Galois field products generated by the multiple Galois field multipliers 411. The consolidated byte 433 for the current clock cycle is a Galois field summation of the set of multiple Galois field products. For example, the one or more Galois field adders 413 generates a summation (B0*a11+B1*a10+ . . . +B10*a1) as the consolidated byte 433.

In embodiments, at a next clock cycle, the set of input bytes for the next clock cycle may be updated from (B0, B1, . . . B10) to (C0, C1, C10), the set of multiple Galois field multipliers 411 perform a set of multiple Galois field products on (C0, C1, . . . C10) and the set of multiple powers of the alpha (a1, a2, a3, a4, a5, a6, a7, a8, a9, a10, a11) to generate 11 Galois field products of the form (C0*a11, C1*a10, . . . , C10*a1). The one or more Galois field adders 413 are to generate the summation of (C0*a11+ C1*a10+ . . . +C10*a1) as the consolidated byte 433 for the next clock cycle. Both the set of input bytes (B0, B1, . . . B10) and (C0, C1, . . . C10) are a part of the input message to the FEC codec 450.

In embodiments, the Galois field multiplier 407 is to perform a Galois field multiplication of the consolidated byte 433 and a power of the alpha, which may be a $3^{rd}$ alpha power, to generate a temporary product 436. The selector 424 coupled to the Galois field multiplier 407 is to select the consolidated byte 433 or the temporary product 436 as the internal input 432 into the sum unit 405. In embodiments, the $3^{rd}$ alpha power is marked as the alpha power value at pre-stage as shown in FIGS. 5-7. For example, the alpha power value at pre-stage for FIG. 6 at port 1 and port 0 both have label 1 representing $\alpha^1$.

In embodiments, the Galois field multiplier 403 is coupled to the storage unit 401 to receive the first staged result 437 and a first power of the alpha 429, which may be referred to as Alpha Power1 in some descriptions below, for the current clock cycle, and to perform a Galois field multiplication of the first staged result 437 and the first power of the alpha 429 to generate a first Galois field product 434 for the current clock cycle. For different clock cycles and different port configurations, the first power of alpha 429 may be different. The selector 427 is to select the first power of the alpha 429 for the current clock cycle based on the current clock cycle count and the port configuration. As examples, FIG. 5-7 show the different first power of the alpha 429 for different ports and clock cycles. For example, the row labeled as "cycle 1 alpha for stage" in FIG. 5, the rows labeled as "cycle 1 alpha for stage," "cycle 2 alpha for stage," "cycle 3 alpha for stage" in FIG. 6, and the rows labeled as "cycle 1 alpha for stage," ... the row labeled as "cycle 7 alpha for stage" in FIG. 7, are all examples of first power of the alpha 429 for different ports and clock cycles.

In embodiments, the sum unit 405 is coupled to the Galois field multiplier 403 and the storage unit 401 to perform a Galois field addition on the internal input 432 based on the consolidated byte 433 for the current clock cycle and the first Galois field product 434 to generate and store a second staged result 435 in the storage unit 401, for subsequent use to generate the check byte.

In embodiments, at the next clock cycle immediately following the current clock cycle, the port encoder 400 is to perform a set of operations on a set of input bytes of the message for the next clock cycle. In detail, the Galois field multiplier 403 is to further receive the second staged result from the storage unit 401, to receive a second power of the alpha 429 for the next clock cycle, and to perform a Galois field multiplication of the second staged result and the second power of the alpha to generate a Galois field product for the next clock cycle. The sum unit 405 is arranged to perform a Galois field addition based on the consolidated byte 433 for the next clock cycle and the Galois field product for the next clock cycle to generate and store a third staged result into the storage unit 401 for subsequent use to generate the check byte. In embodiments, the second power of the alpha for the next clock cycle has a same value as the first power of the alpha 429 for the current clock cycle. For example, as shown in FIG. 7, the cycle 1 alpha for stage has value 11 at port 0, and the cycle 2 alpha for stage has value 11 at port 0, both with the value 11.

In embodiments, the selector 425 is to select the consolidated byte 433 to be sent to the sum unit 405 or the sum unit 421 based on the clock cycle. When the current clock cycle is not the final clock cycle, the consolidated byte 433 is to be sent to the sum unit 405. At the final clock cycle, the consolidated byte 433 is to be sent to the sum unit 421. The sum unit 421 is to perform a Galois field addition based on the consolidated byte 433 for the final clock cycle and the first Galois field product 434 to generate a final sum 439 for subsequent use to generate the check byte.

In embodiments, the Galois field multiplier 423 is to receive the final sum 439, to receive a second power of the alpha (Alpha Power2) 422, and to perform a Galois field multiplication of the final sum and the second power of the alpha to generate the check byte 431 for the message. As examples, FIG. 5-7 show the different the second power of the alpha (Alpha Power 2) 422 for different ports. For example, the row labeled as "final alpha" in FIG. 5, the row labeled as "final alpha" in FIG. 6, and the row labeled as "final alpha" in FIG. 7, are all examples of second power of the alpha (Alpha Power 2) 422.

In some embodiments, Alpha power1 and Alpha Power2 are only a function of port mode configuration for ×16 and ×8 modes, and not a function of clock cycle—this greatly simplifies the logic. Even for a ×4, Alpha Power1 varies between one of 2 values, and this is achieved by passing a token around the 3 sets of FEC. On a cycle where the token is present, a value of 10 may be selected, else it is 11 (FIG. 7). FIG. 5 shows the data byte distribution and Alpha power values ("alpha for stage" rows) and Alpha Power2 values (Final Alpha) for the 4 ports in ×16 configuration that share the data bus. The number in the data row represents the corresponding data byte. The number in an Alpha row represents the corresponding alpha power. FIG. 6 shows a similar structure for ×8 configuration. For a ×8, in specific cycles a Pre-Stage multiplier of 1 is used, which is achieved by using the multiply by alpha leg of the mux shown in FIG. 3. FIG. 7 shows the alpha powers and byte associations for a ×4 configuration.

FIGS. 8 and 9 illustrate various decoding algorithms, in accordance with various embodiments.

FIG. 8 shows a baseline implementation of a 86 byte to 84 byte decoder (with error correction). The method of decoding and error correcting is presented in the code in FIG. 8. First, the encoder is used to compute the check and parity bytes from the received message, e.g., the encoded_data[85:0] in line 801. These are compared (XOR'ed) with the received check and parity bytes to give the SyndCheck and SyndParity results respectively, e.g., line 803 for SyndCheck, and line 805 for SyndParity. The result of the XOR for parity gives the error magnitude if non-zero. A reverse lookup is performed to identify which alpha powers map to the XOR'ed results, and these can be used to identify the location of the error.

FIG. 9 shows an implementation of a 86 byte to 84 byte decoder (with error correction) for improved timing design.

The main complexity in the baseline implementation comes from the reverse look-up that is performed to get the alpha powers, and subsequent math to obtain the error location. However, an embodiment can directly arrive at this result by using an intermediate result of the encoder, e.g., as shown in the code section 811. It is easy to show that in cases of single error, the parity and check syndromes are respectively given by:

$$Synd\text{Parity} = e_k, \; Synd\text{Check} = \alpha^{(84-k)}e_k \qquad \text{(equation 8.1)}$$

where "k" is the location of the error, and $e_k$ is the magnitude of the error.

Thus, for each of the received data bytes, if XOR operation is performed with SyndParity in parallel (to get the error term out), and then multiple the results with the corresponding alpha powers, followed by XOR with the intermediate result of the encoder, the only term that will match SyndCheck will be the byte location in error. This is because as a result of XORing, the information bits may be removed and only the error term remaining. The relevant section of the modified code is presented in FIG. 9.

This method avoids the lookup table for reverse alpha powers (going from byte to alpha power) and the subsequent computation to get the error location. It is a little more area intensive in terms of the parallel XORing, but it saves about 8-10 levels of logic compared to baseline—and it allows us to finish FEC correction+CRC in 1 cycle @1 GHz. Multiple errors are not considered in this scenario, since CRC may be used to detect multiple errors anyway. If a CRC error is presented after FEC correction, the flit may be retried or resent again.

Figure 10:
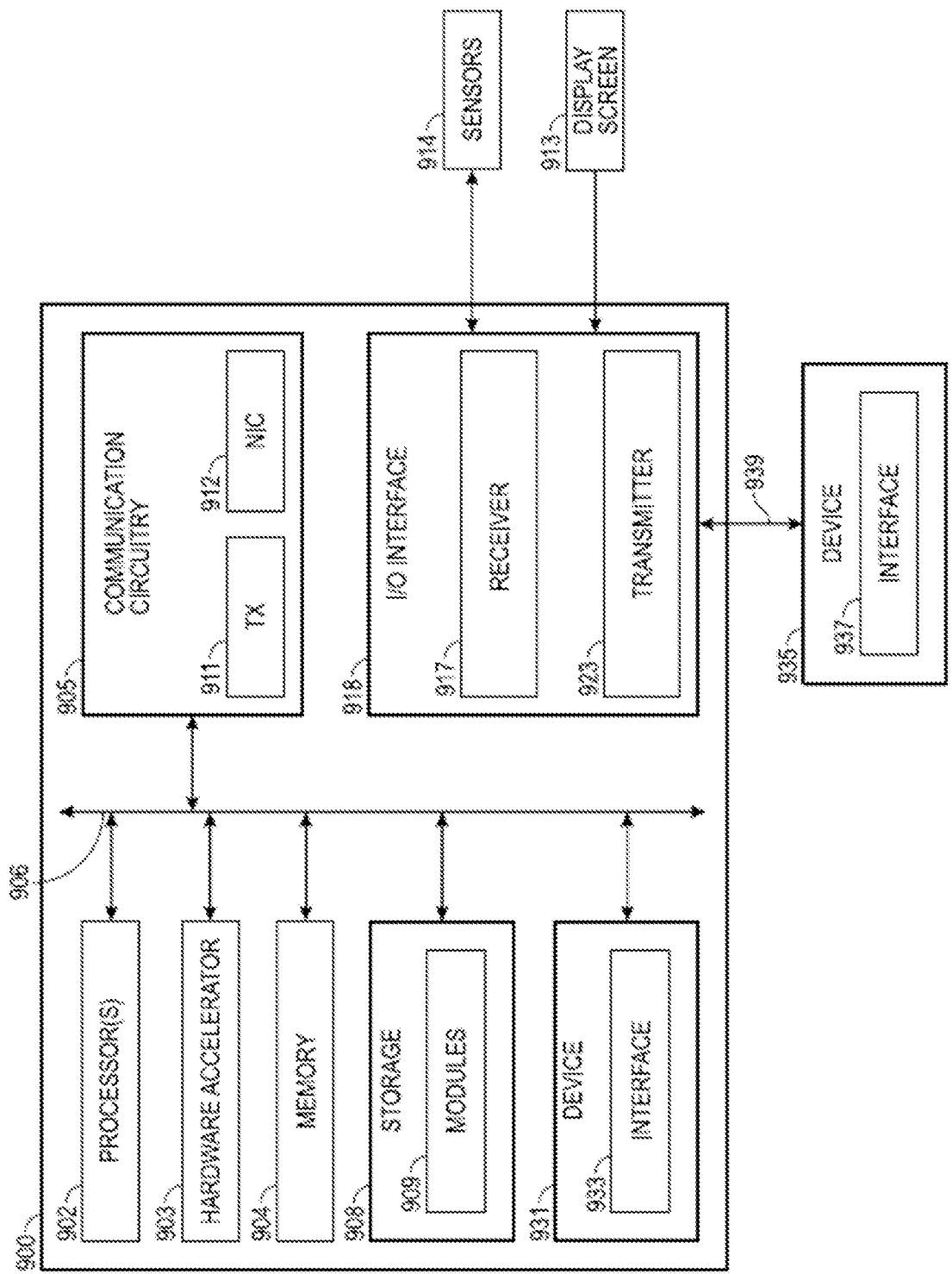
FIG. 10 illustrates an example device suitable for use to practice various aspects of the present disclosure, in accordance with various embodiments.

FIG. 10 illustrates an example device suitable for use to practice various aspects of the present disclosure, in accordance with various embodiments. The device 900 may be used to implement functions of the apparatus 100. As shown, the device 900 may include one or more processors 902, each having one or more processor cores, or and optionally, a hardware accelerator 903 (which may be an ASIC or a FPGA). In alternate embodiments, the hardware accelerator 903 may be part of processor 902, or integrated together on a SOC. Additionally, the device 900 may include a memory 904, which may be any one of a number of known persistent storage medium, and a data storage circuitry 908 including modules 909. In addition, the 900 may include an I/O interface 918, coupled to one or more sensors 914, and a display screen 913. The I/O interface 918 may include a transmitter 923 and a receiver 917. Furthermore, the device 900 may include communication circuitry 905 including a transceiver (Tx) 911, and network interface controller (NIC) 912. The elements (processor 902, hardware accelerator 903, memory 904, storage 908, device 931, communication circuitry 905 and/or I/O interface 918) may be coupled to each other via system bus 906, which may represent one or more buses. In the case of multiple buses, they may be bridged by one or more bus bridges (not shown). Further, a device 931 may be coupled to the system bus 906, and a device 935 may be coupled to a computer bus 939. The device 931 may include an interface 933, and the device 935 may include an interface 937. In embodiments, the computer bus 906 or the computer bus 939 may be an example of the computer bus 105 as shown in FIG. 1. That is, the interface (transmitter/receiver) circuitry of processor 902, hardware accelerator 903, memory 904, storage 908, device 931, communication circuitry 905, I/O interface 918 and/or devices 931/935 may be incorporated with the FEC encoder teachings of the present disclosure, as earlier described.

In embodiments, the processor(s) 902 (also referred to as "processor circuitry 902") may be one or more processing elements configured to perform basic arithmetical, logical, and input/output operations by carrying out instructions. Processor circuitry 902 may be implemented as a standalone system/device/package or as part of an existing system/device/package. The processor circuitry 902 may be one or more microprocessors, one or more single-core processors, one or more multi-core processors, one or more multi-threaded processors, one or more GPUs, one or more ultra-low voltage processors, one or more embedded processors, one or more DSPs, one or more FPDs (hardware accelerators) such as FPGAs, structured ASICs, programmable SoCs (PSoCs), etc., and/or other processor or processing/controlling circuit. The processor circuitry 902 may be a part of a SoC in which the processor circuitry 902 and other components discussed herein are formed into a single IC or a single package. As examples, the processor circuitry 902 may include one or more Intel Pentium®, Core®, Xeon®, Atom®, or Core M® processor(s); Advanced Micro Devices (AMD) Accelerated Processing Units (APUs), Epyc®, or Ryzen® processors; Apple Inc. A series, S series, W series, etc. processor(s); Qualcomm Snapdragon® processor(s); Samsung Exynos® processor(s); and/or the like.

In embodiments, the processor circuitry 902 may include a sensor hub, which may act as a coprocessor by processing data obtained from the one or more sensors 914. The sensor hub may include circuitry configured to integrate data obtained from each of the one or more sensors 914 by performing arithmetical, logical, and input/output operations. In embodiments, the sensor hub may capable of timestamping obtained sensor data, providing sensor data to the processor circuitry 902 in response to a query for such data, buffering sensor data, continuously streaming sensor data to the processor circuitry 902 including independent streams for each sensor of the one or more sensors 914, reporting sensor data based upon predefined thresholds or conditions/triggers, and/or other like data processing functions.

In embodiments, the memory 904 (also referred to as "memory circuitry 904" or the like) may be circuitry configured to store data or logic for operating the computer device 900. The memory circuitry 904 may include number of memory devices may be used to provide for a given amount of system memory. As examples, the memory circuitry 904 can be any suitable type, number and/or combination of volatile memory devices (e.g., random access memory (RAM), dynamic RAM (DRAM), static RAM (SAM), etc.) and/or non-volatile memory devices (e.g., read-only memory (ROM), erasable programmable read-only memory (EPROM), electrically erasable programmable read-only memory (EEPROM), flash memory, anti-fuses, etc.) that may be configured in any suitable implementation as are known. In various implementations, individual memory devices may be formed of any number of different package types, such as single die package (SDP), dual die package (DDP) or quad die package, dual inline memory modules (DIMMs) such as microDIMMs or Mini-DIMMs, and/or any other like memory devices. To provide for persistent storage of information such as data, applications, operating systems and so forth, the memory circuitry 904 may include one or more mass-storage devices, such as a solid state disk drive (SSDD); flash memory cards, such as SD cards, microSD cards, xD picture cards, and the like, and USB flash drives; on-die memory or registers associated with the processor circuitry 902 (for example, in low power implementations); a micro hard disk drive (HDD); three dimensional cross-point (3D XPOINT) memories from Intel® and Micron®, etc.

Where FPDs are used, the processor circuitry 902 and memory circuitry 904 (and/or data storage circuitry 908) may comprise logic blocks or logic fabric, memory cells, input/output (I/O) blocks, and other interconnected resources that may be programmed to perform various functions of the example embodiments discussed herein. The memory cells may be used to store data in lookup-tables (LUTs) that are used by the processor circuitry 902 to implement various logic functions. The memory cells may include any combination of various levels of memory/storage including, but not limited to, EPROM, EEPROM, flash memory, SRAM, anti-fuses, etc.

In embodiments, the data storage circuitry 908 (also referred to as "storage circuitry 908" or the like), with shared or respective controllers, may provide for persistent storage of information such as modules 909, operating systems, etc. The data storage circuitry 908 may be implemented as solid state drives (SSDs); solid state disk drive (SSDD); serial AT attachment (SATA) storage devices (e.g., SATA SSDs); flash drives; flash memory cards, such as SD cards, microSD cards, xD picture cards, and the like, and USB flash drives; three-dimensional cross-point (3D Xpoint) memory devices; on-die memory or registers associated with the processor circuitry 902; hard disk drives (HDDs); micro HDDs; resistance change memories; phase change memories; holographic memories; or chemical memories; among others. As shown, the data storage circuitry 908 is included in the computer device 900; however, in other embodiments, the data storage circuitry 908 may be implemented as one or more devices separated from the other elements of computer device 900.

In some embodiments, the data storage circuitry 908 may include an operating system (OS) (not shown), which may be a general purpose operating system or an operating system specifically written for and tailored to the computer device 900. The OS may include one or more drivers, libraries, and/or application programming interfaces (APIs), which provide program code and/or software components for modules 909 and/or control system configurations to control and/or obtain/process data from the one or more sensors 914.

The modules 909 may be software modules/components used to perform various functions of the computer device 900 and/or to carry out functions of the example embodiments discussed herein. In embodiments where the processor circuitry 902 and memory circuitry 904 includes hardware accelerators (e.g., FPGA cells, the hardware accelerator 903) as well as processor cores, the hardware accelerators (e.g., the FPGA cells) may be pre-configured (e.g., with appropriate bit streams, logic blocks/fabric, etc.) with the logic to perform some functions of the embodiments herein (in lieu of employment of programming instructions to be executed by the processor core(s)). For example, the modules 909 may comprise logic for the corresponding entities discussed with regard to the display screen 913, the transmitter 923, and the receiver 917.

The components of computer device 900 may communicate with one another over the bus 906. The bus 906 may include any number of technologies, such as a Local Interconnect Network (LIN); industry standard architecture (ISA); extended ISA (EISA); PCI; PCI extended (PCIx); PCIe; an Inter-Integrated Circuit (I2C) bus; a Parallel Small Computer System Interface (SPI) bus; Common Application Programming Interface (CAPI); point to point interfaces; a power bus; a proprietary bus, for example, Intel® Ultra Path Interface (UPI), Intel® Accelerator Link (IAL), or some other proprietary bus used in a SoC based interface; or any number of other technologies. In some embodiments, the bus 906 may be a controller area network (CAN) bus system, a Time-Trigger Protocol (TTP) system, or a FlexRay system, which may allow various devices (e.g., the one or more sensors 914, etc.) to communicate with one another using messages or frames.

The communications circuitry 905 may include circuitry for communicating with a wireless network or wired network. For example, the communication circuitry 905 may include transceiver (Tx) 911 and network interface controller (NIC) 912. Communications circuitry 905 may include one or more processors (e.g., baseband processors, modems, etc.) that are dedicated to a particular wireless communication protocol.

NIC 912 may be included to provide a wired communication link to a network and/or other devices. The wired communication may provide an Ethernet connection, an Ethernet-over-USB, and/or the like, or may be based on other types of networks, such as DeviceNet, ControlNet, Data Highway+, PROFIBUS, or PROFINET, among many others. An additional NIC 912 may be included to allow connect to a second network (not shown) or other devices, for example, a first NIC 912 providing communications to the network over Ethernet, and a second NIC 912 providing communications to other devices over another type of network, such as a personal area network (PAN) including a personal computer (PC) device. In some embodiments, the various components of the device 900, such as the one or more sensors 914, etc. may be connected to the processor(s) 902 via the NIC 912 as discussed above rather than via the I/O circuitry 918 as discussed infra.

The Tx 911 may include one or more radios to wirelessly communicate with a network and/or other devices. The Tx 911 may include hardware devices that enable communication with wired networks and/or other devices using modulated electromagnetic radiation through a solid or non-solid medium. Such hardware devices may include switches, filters, amplifiers, antenna elements, and the like to facilitate the communications over the air (OTA) by generating or otherwise producing radio waves to transmit data to one or more other devices, and converting received signals into usable information, such as digital data, which may be provided to one or more other components of computer device 900. In some embodiments, the various components of the device 900, such as the one or more sensors 914, etc. may be connected to the device 900 via the Tx 911 as discussed above rather than via the I/O circuitry 918 as discussed infra. In one example, the one or more sensors 914 may be coupled with device 900 via a short range communication protocol.

The Tx 911 may include one or multiple radios that are compatible with any number of 3GPP (Third Generation Partnership Project) specifications, notably Long Term Evolution (LTE), Long Term Evolution-Advanced (LTE-A), Long Term Evolution-Advanced Pro (LTE-A Pro), and Fifth Generation (5G) New Radio (NR). It can be noted that radios compatible with any number of other fixed, mobile, or satellite communication technologies and standards may be selected. These may include, for example, any Cellular Wide Area radio communication technology, which may include e.g. a 5G communication systems, a Global System for Mobile Communications (GSM) radio communication technology, a General Packet Radio Service (GPRS) radio communication technology, or an Enhanced Data Rates for GSM Evolution (EDGE) radio communication technology. Other Third Generation Partnership Project (3GPP) radio communication technology that may be used includes UMTS (Universal Mobile Telecommunications System), FOMA (Freedom of Multimedia Access), 3GPP LTE (Long Term Evolution), 3GPP LTE Advanced (Long Term Evolution Advanced), 3GPP LTE Advanced Pro (Long Term Evolution Advanced Pro)), CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High Speed Packet Access), HSDPA (High-Speed Downlink Packet Access), HSUPA (High-Speed Uplink Packet Access), HSPA+(High Speed Packet Access Plus), UMTS-TDD (Universal Mobile Telecommunications System-Time-Division Duplex), TD-CDMA (Time Division-Code Division Multiple Access), TD-SCDMA (Time Division-Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP LTE Extra, LTE Licensed-Assisted Access (LAA), UTRA (UMTS Terrestrial Radio Access), E-UTRA (Evolved UMTS Terrestrial Radio Access), LTE Advanced (4G) (Long Term Evolution Advanced (4th Generation)), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), D-AMPS (2G) (Digital AMPS (2nd Generation)), PTT (Push-to-talk), MTS (Mobile Telephone System), WITS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem D, or Mobile telephony system D), Autotel/PALM (Public Automated Land Mobile), ARP (Finnish for Autoradiopuhelin, "car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handy-phone System), WiDEN (Wideband Integrated Digital Enhanced Network), iBurst, Unlicensed Mobile Access (UMA, also referred to as also referred to as 3GPP Generic Access Network, or GAN standard)), Wireless Gigabit Alliance (WiGig) standard, mmWave standards in general (wireless systems operating at 10-90 GHz and above such as WiGig, IEEE 802.11ad, IEEE 802.11ay, and the like. In addition to the standards listed above, any number of satellite uplink technologies may be used for the uplink transceiver, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated. Implementations, components, and details of the aforementioned protocols may be those known in the art and are omitted herein for the sake of brevity.

The input/output (I/O) interface 918 may include circuitry, such as an external expansion bus (e.g., Universal Serial Bus (USB), FireWire, Thunderbolt, PCI/PCIe/PCIx, etc.), used to connect computer device 900 with external components/devices, such as one or more sensors 914, etc. I/O interface circuitry 918 may include any suitable interface controllers and connectors to interconnect one or more of the processor circuitry 902, memory circuitry 904, data storage circuitry 908, communication circuitry 905, and the other components of computer device 900. The interface controllers may include, but are not limited to, memory controllers, storage controllers (e.g., redundant array of independent disk (RAID) controllers, baseboard management controllers (BMCs), input/output controllers, host controllers, etc. The connectors may include, for example, busses (e.g., bus 906), ports, slots, jumpers, interconnect modules, receptacles, modular connectors, etc. The I/O circuitry 918 may couple the device 900 with the one or more sensors 914, etc. via a wired connection, such as using USB, FireWire, Thunderbolt, RCA, a video graphics array (VGA), a digital visual interface (DVI) and/or mini-DVI, a high-definition multimedia interface (HDMI), an S-Video, and/or the like.

The one or more sensors 914 may be any device configured to detect events or environmental changes, convert the detected events into electrical signals and/or digital data, and transmit/send the signals/data to the computer device 900. Some of the one or more sensors 914 may be sensors used for providing computer-generated sensory inputs. Some of the one or more sensors 914 may be sensors used for motion and/or object detection. Examples of such one or more sensors 914 may include, inter alia, charged-coupled devices (CCD), Complementary metal-oxide-semiconductor (CMOS) active pixel sensors (APS), lens-less image capture devices/cameras, thermographic (infrared) cameras, Light Imaging Detection And Ranging (LIDAR) systems, and/or the like. In some implementations, the one or more sensors 914 may include a lens-less image capture mechanism comprising an array of aperture elements, wherein light passing through the array of aperture elements define the pixels of an image. In embodiments, the motion detection one or more sensors 914 may be coupled with or associated with light generating devices, for example, one or more infrared projectors to project a grid of infrared light onto a scene, where an infrared camera may record reflected infrared light to compute depth information.

Some of the one or more sensors 914 may be used for position and/or orientation detection, ambient/environmental condition detection, and the like. Examples of such one or more sensors 914 may include, inter alia, microelectromechanical systems (MEMS) with piezoelectric, piezoresistive and/or capacitive components, which may be used to determine environmental conditions or location information related to the computer device 900. In embodiments, the MEMS may include 3-axis accelerometers, 3-axis gyroscopes, and/or magnetometers. In some embodiments, the one or more sensors 914 may also include one or more gravimeters, altimeters, barometers, proximity sensors (e.g., infrared radiation detector(s) and the like), depth sensors, ambient light sensors, thermal sensors (thermometers), ultrasonic transceivers, and/or the like.

Each of these elements, e.g., one or more processors 902, the hardware accelerator 903, the memory 904, the data storage circuitry 908 including the modules 909, the input/output interface 918, the one or more sensors 914, the communication circuitry 905 including the Tx 911, the NIC 912, the system bus 906, the computer bus 939, the device 931, the device 935, may perform its conventional functions known in the art. In addition, they may be employed to store and host execution of programming instructions implementing the operations associated with encoder and decoder of forward error correction (FEC) codes for computer buses as described in connection with FIGS. 1-9, and/or other functions that provides the capability of the embodiments described in the current disclosure. The various elements may be implemented by assembler instructions supported by processor(s) 902 or high-level languages, such as, for example, C, that can be compiled into such instructions. Operations associated with the device 900 not implemented in software may be implemented in hardware, e.g., via hardware accelerator 903.

The number, capability and/or capacity of these elements 902-939 may vary, depending on the number of other devices the device 900 is configured to support. Otherwise, the constitutions of elements 902-939 are known, and accordingly will not be further described.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Furthermore, the present disclosure may take the form of a computer program product embodied in any tangible or non-transitory medium of expression having computer-usable program code embodied in the medium. FIG. 11 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 1002 may include a number of programming instructions 1004. Programming instructions 1004 may be configured to enable a device, e.g., device 1000 (which may be device 100 or 900), in response to execution of the programming instructions, to perform, e.g., various operations associated with encoder and decoder of forward error correction (FEC) codes for computer buses, as shown in FIGS. 1-9.

In alternate embodiments, programming instructions 1004 may be disposed on multiple computer-readable non-transitory storage media 1002 instead. In alternate embodiments, programming instructions 1004 may be disposed on computer-readable transitory storage media 1002, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment are chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

Examples

Example 1 may include a forward error correction (FEC) codec for generating a check byte for a message, comprising: a port encoder to perform a set of operations on a current set of input bytes of the message for a current clock cycle, wherein the port encoder includes: a storage unit to store a first staged result, accumulated based on previous sets of input bytes of the message for all clock cycles from a first clock cycle to a clock cycle immediately prior to the current clock cycle; a Galois field multiplier coupled to the storage unit to receive the first staged result and a first power of an alpha for the current clock cycle, and to perform a Galois field multiplication of the first staged result and the first power of the alpha to generate a first Galois field product for the current clock cycle; and a sum unit coupled to the Galois field multiplier and the storage unit to perform a Galois field addition on an internal input based on a consolidated byte for the current clock cycle and the first Galois field product to generate and store a second staged result in the storage unit, for subsequent use to generate the check byte; wherein the consolidated byte for the current clock cycle is a Galois field summation of a second set of multiple Galois field products generated based on the current set of input bytes and a second set of multiple powers of the alpha, a Galois field product of the second set of multiple Galois field products is a Galois field product of an input byte of the current set of input bytes, and a power of the alpha selected from the second set of multiple powers of the alpha, and wherein the alpha is a unit root of a primitive polynomial over a Galois field.

Example 2 may include the FEC codec of example 1 and/or some other examples herein, wherein the Galois field multiplier is a first Galois field multiplier, and the port encoder further includes: a second set of multiple Galois field multipliers to generate the second set of multiple Galois field products based on the current set of input bytes and the second set of multiple powers of the alpha; and one or more Galois field adders coupled to the second set of multiple Galois field multipliers to generate the consolidated byte for the current clock cycle based on the second set of multiple Galois field products.

Example 3 may include the FEC codec of example 1 and/or some other examples herein, wherein the Galois field multiplier is a first Galois field multiplier, and the port encoder further includes: a second Galois field multiplier to perform a Galois field multiplication of the consolidated byte and a second power of the alpha to generate a temporary product; and a selector coupled to the second Galois field multiplier to select the consolidated byte or the temporary product as the internal input into the sum unit.

Example 4 may include the FEC codec of example 1 and/or some other examples herein, wherein the storage unit is a first storage unit of the port encoder, and the port encoder further includes a second storage unit to store the current set of input bytes and the second set of multiple powers of the alpha.

Example 5 may include the FEC codec of example 1 and/or some other examples herein, wherein, at a next clock cycle immediately following the current clock cycle, the port encoder is to perform a set of operations on a set of input bytes of the message for the next clock cycle, wherein: the Galois field multiplier is to further receive the second staged result from the storage unit, to receive a second power of the alpha for the next clock cycle, and to perform a Galois field multiplication of the second staged result and the second power of the alpha to generate a third Galois field product for the next clock cycle; and the sum unit is arranged to perform a Galois field addition based on a consolidated byte for the next clock cycle and the third Galois field product for the next clock cycle to generate and store a third staged result into the storage unit for subsequent use to generate the check byte, wherein the consolidated byte for the next clock cycle is a Galois field summation of a third set of multiple Galois field products generated based on the set of input bytes of the message for the next clock cycle and the second set of multiple powers of the alpha, a Galois field product of the third set of multiple Galois field products is a Galois field product of an input byte of the set of input bytes of the message for the next clock cycle, and a power of the alpha selected from the second set of multiple powers of the alpha.

Example 6 may include the FEC codec of example 5 and/or some other examples herein, wherein the second power of the alpha for the next clock cycle has a same value as the first power of the alpha for the current clock cycle.

Example 7 may include the FEC codec of example 1 and/or some other examples herein, wherein the sum unit is a first sum unit, and the port encoder further includes a second sum unit coupled to the Galois field multiplier, wherein the second sum unit is to perform a Galois field addition based on the consolidated byte for the current clock cycle and the first Galois field product to generate a final sum for subsequent use to generate the check byte, wherein the consolidated byte for the current clock cycle is a Galois field summation of the second set of multiple Galois field products generated based on the current set of input bytes and the second set of multiple powers of the alpha.

Example 8 may include the FEC codec of example 7 and/or some other examples herein, wherein the Galois field multiplier is a first Galois field multiplier, and the port encoder further includes a second Galois field multiplier coupled to the second sum unit, wherein the second Galois field multiplier is to receive the final sum generated by the second sum unit, to receive a second power of the alpha, and to perform a Galois field multiplication of the final sum and the second power of the alpha to generate the check byte for the message.

Example 9 may include the FEC codec of example 7 and/or some other examples herein, wherein the port encoder further includes: a first selector to select the consolidated byte for the current clock cycle to be sent to the first sum unit or the second sum unit based on the current clock cycle; a second selector to select the first power of the alpha for the current clock cycle based on the current clock cycle.

Example 10 may include the FEC codec of example 1 and/or some other examples herein, wherein the primitive polynomial is alpha^8+alpha^4+alpha^3+alpha^2+1, and the Galois field is $GF(2^8)$.

Example 11 may include the FEC codec of example 1 and/or some other examples herein, wherein the second set of multiple Galois field products includes 11 Galois field products, the set of multiple input bytes for the current clock cycle includes no more than 11 input bytes, and the second set of multiple powers of the alpha includes a power of the alpha from 1 to 11.

Example 12 may include the FEC codec of example 1 and/or some other examples herein, wherein the port encoder is a first port encoder, and the FEC codec further includes one or more additional port encoders, wherein each port encoder of the one or more additional port encoders is identically constituted as the first port encoder.

Example 13 may include the FEC codec of example 12 and/or some other examples herein, wherein the FEC codec is disposed in a PCIe bus, and the FEC codec includes total 1 port encoders including the first port encoder for a ×16 link in the PCI-e bus; or wherein the FEC codec includes total 2 port encoders including the first port encoder and the one or more encoders for a ×8 link in the PCI-e bus; or wherein the FEC codec includes total 4 port encoders including the first port encoder and the one or more encoders for a ×4 link in the PCI-e bus; or wherein the FEC codec includes total 8 port encoders including the first port encoder and the one or more encoders for a ×2 link in the PCI-e bus; or wherein the FEC codec includes total 16 port encoders including the first port encoder and the one or more encoders for a ×1 link in the PCI-e bus; and the multiple input bytes is a part of a flit.

Example 14 may include the FEC codec of example 1 and/or some other examples herein, wherein the FEC codec includes a decoder, and the port encoder is included in the decoder, and wherein the decoder further includes a Galois field adder to perform bitwise XOR with the first staged result or the second staged result to identify an error location of the message.

Example 15 may include a communication device, comprising: a set of multiple forward error correction (FEC) encoders, each FEC encoder receiving an input message as a part of an input string to the communication device; and wherein a FEC encoder is further arranged to divide the input message to the FEC encoder into multiple input substrings to feed into one or more port encoders of the FEC encoder in multiple clock cycles to generate a check byte for the input message to the FEC encoder, wherein an input substring at a current clock cycle includes a current set of input bytes of the message for the current clock cycle, and wherein a port encoder of the one or more port encoders includes: a set of multiple Galois field multipliers to generate a set of multiple Galois field products based on the current set of input bytes of the message and a set of multiple powers of an alpha, a Galois field product of the set of multiple Galois field products is a Galois field product of an input byte of the current set of input bytes, and a power of the alpha selected from the set of multiple powers of the alpha, and wherein the alpha is a unit root of a primitive polynomial over a Galois field; one or more Galois field adders coupled to the set of multiple Galois field multipliers to generate a Galois field summation of the set of multiple Galois field products as a consolidated byte for the current clock cycle; and a storage unit to store a staged result for the current clock cycle, accumulated based on previous sets of input bytes of the message for all clock cycles from a first clock cycle to a clock cycle immediately prior to the current clock cycle, wherein the check byte for the input message to the FEC encoder is generated based on the consolidated byte for the current clock cycle and the staged result stored in the storage unit of the port encoder.

Example 16 may include the communication device of example 15 and/or some other examples herein, wherein the staged result is a first staged result, and the port encoder further includes: a Galois field multiplier coupled to the storage unit to receive the first staged result and a power of the alpha for the current clock cycle, and to perform a Galois field multiplication of the first staged result and the power of the alpha to generate a second Galois field product for the current clock cycle; and a sum unit coupled to the Galois field multiplier and the storage unit to perform a Galois field addition on an internal input based on the consolidated byte for the current clock cycle and the second Galois field product to generate and store a second staged result in the storage unit, for subsequent use to generate the check byte.

Example 17 may include the communication device of example 15 and/or some other examples herein, wherein any two messages of the multiple input messages to feed to the set of multiple FEC encoders have equal length.

Example 18 may include the communication device of example 15 and/or some other examples herein, wherein the communication device is disposed in a PCIe bus, the input message to the FEC encoder is a part of a flit, and a number for the multiple clock cycles to generate the check byte for the input message to the FEC encoder depends on a size of the flit and a width of the port encoder.

Example 19 may include the communication device of example 18 and/or some other examples herein, wherein the FEC encoder is to generate the check byte for the input message to the FEC encoder in 2 cycles for a ×16 link in the PCI-e bus, 4 cycles for a ×8 link in the PCI-e bus, or 8 cycles for a ×2 link in the PCI-e bus.

Example 20 may include the communication device of example 18 and/or some other examples herein, further including: an interleaver coupled to the set of multiple FEC encoders to receive the check byte for the input message to the FEC encoder, to generate an output string including the input string plus a number of check bytes generated by the set of multiple FEC encoders.

Example 21 may include a method for a forward error correction (FEC) codec to generate a check byte for a message, comprising: receiving, at a current clock cycle by a port encoder of the FEC codec, a current set of input bytes of the message to the port encoder; generating a consolidated byte for the current clock cycle, wherein the consolidated byte is a Galois field summation of a first set of multiple Galois field products generated based on the current set of input bytes and a first set of multiple powers of an alpha, a Galois field product of the first set of multiple Galois field products is a Galois field product of an input byte of the current set of input bytes, and a power of the alpha selected from the first set of multiple powers of the alpha; providing, at the current clock cycle, from a storage unit of the port encoder, a first staged result accumulated based on previous sets of input bytes of the message for all clock cycles from a first clock cycle to a clock cycle immediately prior to a current clock cycle; performing, by a Galois field multiplier of the port encoder, a Galois field multiplication of the first staged result and a second power of the alpha to generate a second Galois field product for the current clock cycle; and performing, by a sum unit of the port encoder, a Galois field addition on an internal input based on the consolidated byte for the current clock cycle and the second Galois field product to generate and store a second staged result in the storage unit, for subsequent use to generate the check byte; wherein the alpha is a unit root of a primitive polynomial over a Galois field.

Example 22 may include the method of example 21 and/or some other examples herein, further comprising: performing a Galois field multiplication of the consolidated byte and a second power of the alpha to generate a temporary product; and selecting the consolidated byte or the temporary product as the internal input into the sum unit to perform the Galois field addition to generate the second staged result.

Example 23 may include the method of example 21 and/or some other examples herein, further comprising: performing a Galois field addition based on the consolidated byte for the current clock cycle and the first Galois field product to generate a final sum for subsequent use to generate the check byte, wherein the consolidated byte for the current clock cycle is a Galois field summation of the first set of multiple Galois field products generated based on the current set of input bytes and the first set of multiple powers of the alpha.

Example 24 may include the method of example 23 and/or some other examples herein, further comprising: receiving the final sum generated by the second sum unit; receiving a second power of the alpha; and performing a Galois field multiplication of the final sum and the second power of the alpha to generate the check byte for the message.

Example 25 may include the method of example 21 and/or some other examples herein, wherein the primitive polynomial is alpha^8+alpha^4+alpha^3+alpha^2+1, and the Galois field is GF($2^8$).

Example 26 may include an apparatus comprising: means for managing various operations associated with encoder and decoder of forward error correction (FEC) codes for computer buses.

Example 27 may include the apparatus of example 1 and/or some other examples herein, wherein the computer buses include PCI buses.

Example 28 may include an apparatus comprising means to perform one or more elements of a method described in or related to any of examples herein, or any other method or process described herein.

Example 29 may include one or more non-transitory computer-readable media comprising instructions to cause an electronic device, upon execution of the instructions by one or more processors of the electronic device, to perform one or more elements of a method described in or related to any of examples herein, or any other method or process described herein.

Example 30 may include an apparatus comprising logic, modules, or circuitry to perform one or more elements of a method described in or related to any of examples herein, or any other method or process described herein.

Example 31 may include a method, technique, or process as described in or related to any of examples herein, or portions or parts thereof.

Example 32 may include an apparatus comprising: one or more processors and one or more computer readable media comprising instructions that, when executed by the one or more processors, cause the one or more processors to perform the method, techniques, or process as described in or related to any of examples herein, or portions thereof.

Example 33 may include a signal as described in or related to any of examples herein, or portions or parts thereof.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

What is claimed is:

1. A forward error correction (FEC) encoder for generating a check byte for a message, wherein the FEC encoder is to:
    generate respective check bytes for second through nth respective sets of the input bytes in respective current clock cycles, wherein to generate the respective check bytes, the FEC encoder is to:
        generate, based on a power of an alpha for the respective current clock cycle and a first staged result that is related to one or more previous sets of input bytes of the message for one or more previous clock cycles, a Galois field product for the respective current clock cycle;
        generate a consolidated byte related to the respective current clock cycle based on check bytes of the one or more previous sets of input bytes; and
        generate, based on the first-Galois field product and the consolidated byte related to the respective current clock cycle, a second staged result;
    generate, based on the second staged result of a final set of the n sets of input bytes, the check byte for the message; and
    send a signal that includes the check byte for the message over a computer bus.

2. The FEC encoder of claim 1, wherein the alpha is a unit root of a primitive polynomial over a Galois field.

3. The FEC encoder of claim 1, wherein generation of the second staged result is based on Galois field addition related to the consolidated byte and the first Galois field product.

4. The FEC encoder of claim 1, wherein generation of the first Galois field product is based on Galois field multiplication of the first staged result and the first power of the alpha.

5. The FEC encoder of claim 1, wherein the first staged result is based on all clock cycles from a first clock cycle related to the message to a clock cycle immediately prior to the respective current clock cycle.

6. The FEC encoder of claim 1, wherein the FEC encoder is further to generate the consolidated byte based on a current set of input bytes of the message and a set of multiple powers of the alpha.

7. The FEC encoder of claim 6, wherein the current set of the input bytes is related to the respective current clock cycle.

8. A port encoder for use in a forward error correction (FEC) codec, wherein the port encoder is configured to:
    generate, based on a first power of an alpha (α) for a current clock cycle and a first staged result that is related to one or more previous sets of input bytes of a message for one or more previous clock cycles, a first Galois field product for the current clock cycle, wherein the message has L bytes;
    generate, based on the first Galois field product and a consolidated byte related to the current clock cycle, a second staged result;
    generate, based on the second staged result, a check byte related to the message; and
    transmit a signal that includes the check byte over a compute bus; wherein:
        the message is a portion of a distributed message that is distributed between a plurality of FEC codecs;

the check byte is generated as $$C = \Sigma_{i=0}^{L} B_i * \alpha^{(L-i)};$$

$$\alpha^{(x+y)} \bmod g(x) = [\alpha^x [\alpha^y \bmod g(x)]] \bmod g(x);$$

$B_i$ is an ith byte of the message; and $g(x)$ is a primitive polynomial over a Galois field GF($2^m$).

9. The port encoder of claim 8, wherein the alpha is a unit root of the primitive polynomial over the Galois field.

10. The port encoder of claim 8, wherein generation of the second staged result is based on Galois field addition related to the consolidated byte and the first Galois field product.

11. The port encoder of claim 8, wherein generation of the first Galois field product is based on Galois field multiplication of the first staged result and the first power of the alpha.

12. The port encoder of claim 8, wherein the first staged result is based on all clock cycles from a first clock cycle related to the message to a clock cycle immediately prior to the current clock cycle.

13. The port encoder of claim 8, wherein the port encoder is further to generate the consolidated byte based on a current set of input bytes of the message and a second set of multiple powers of the alpha.

14. The port encoder of claim 13, wherein the current set of the input bytes is related to the current clock cycle.

15. The port encoder of claim 8, wherein the port encoder is configured to determine a parity byte P of the message having L bytes as:

$$P = \Sigma_{i=0}^{L} B_i.$$

16. A method for a forward error correction (FEC) encoder to generate a check byte related to a message, wherein the method comprises:

generating respective check bytes for second through nth respective sets of the input bytes in respective current clock cycles, wherein the generating comprises:
  generating, based on a power of an alpha for the respective current clock cycle and a first staged result that is related to one or more previous sets of input bytes of a message for one or more previous clock cycles, a Galois field product for the respective current clock cycle;
  generating a consolidated byte related to the respective current clock cycle based on check bytes of the one or more previous sets of input bytes; and
  generating, based on the Galois field product and the consolidated byte related to the respective current clock cycle, a second staged result;
generating, based on the second staged result of a final set of the n sets of input bytes, the check byte for the message; and
transmitting a signal comprising the check byte for the message over a compute bus.

17. The method of claim 16, wherein generation of the second staged result is based on Galois field addition related to the consolidated byte and the first Galois field product.

18. The method of claim 16, wherein generation of the first Galois field product is based on Galois field multiplication of the first staged result and the power of the alpha.

19. The method of claim 16, wherein the first staged result is based on all clock cycles from a first clock cycle related to the message to a clock cycle immediately prior to the respective current clock cycle.

20. The method of claim 16, wherein the method further comprises generating the consolidated byte based on a current set of input bytes of the message and a set of multiple powers of the alpha.

\* \* \* \* \*

UNITED STATES PATENT AND TRADEMARK OFFICE
CERTIFICATE OF CORRECTION

PATENT NO. : 12,244,326 B2
APPLICATION NO. : 18/355332
DATED : March 4, 2025
INVENTOR(S) : Debendra Das Sharma and Swadesh Choudhary Page 1 of 1

It is certified that error appears in the above-identified patent and that said Letters Patent is hereby corrected as shown below:

In the Claims

Column 30
Line 22 "generate, based on the first-Galois field product and the" should read --generate, based on the Galois field product and the--

Signed and Sealed this
Nineteenth Day of August, 2025

Coke Morgan Stewart
*Acting Director of the United States Patent and Trademark Office*